(12) United States Patent
Morrison et al.

(10) Patent No.: US 8,150,643 B1
(45) Date of Patent: Apr. 3, 2012

(54) METHOD OF DETECTING SYSTEM FUNCTION BY MEASURING FREQUENCY RESPONSE

(75) Inventors: John L. Morrison, Butte, MT (US); William H. Morrison, Manchester, CT (US); Jon P. Christophersen, Idaho Falls, ID (US)

(73) Assignees: Battelle Energy Alliance, LLC, Idaho Falls, ID (US); Montana Tech of the University of Montana, Butte, MT (US); Qualtech Systems, Inc., East Hartford, CT (US)

( * ) Notice: Subject to any disclaimer, the term of this patent is extended or adjusted under 35 U.S.C. 154(b) by 272 days.

(21) Appl. No.: 12/217,013

(22) Filed: Jun. 30, 2008

Related U.S. Application Data

(63) Continuation-in-part of application No. 11/825,629, filed on Jul. 5, 2007, now Pat. No. 7,395,163, which is a continuation of application No. 11/313,546, filed on Dec. 20, 2005, now abandoned.

(60) Provisional application No. 60/637,969, filed on Dec. 20, 2004, provisional application No. 60/724,631, filed on Oct. 7, 2005.

(51) Int. Cl.
   *G01R 23/00* (2006.01)
   *G06F 11/00* (2006.01)
(52) U.S. Cl. ............ 702/75; 702/79; 702/117; 324/603
(58) Field of Classification Search .................... 702/75, 702/117, 79
   See application file for complete search history.

(56) References Cited

U.S. PATENT DOCUMENTS

| | | | |
|---|---|---|---|
| 5,061,890 | A | 10/1991 | Longini |
| 5,406,496 | A | 4/1995 | Quinn |
| 5,454,377 | A | 10/1995 | Dzwonczyk et al. |
| 5,512,832 | A | 4/1996 | Russell et al. |
| 5,946,482 | A | 8/1999 | Barford et al. |
| 6,208,147 | B1 | 3/2001 | Yoon et al. |
| 6,249,186 | B1 * | 6/2001 | Ebihara et al. ............... 330/277 |

(Continued)

FOREIGN PATENT DOCUMENTS

JP    2000-009817 A    1/2000

OTHER PUBLICATIONS

FreedomCar Battery Test Manual, manual, Oct. 2003, Idaho National Laboratory, 25 pages.

(Continued)

*Primary Examiner* — Hal Wachsman
(74) *Attorney, Agent, or Firm* — TraskBritt

(57) ABSTRACT

Real-time battery impedance spectrum is acquired using a one-time record. Fast Summation Transformation (FST) is a parallel method of acquiring a real-time battery impedance spectrum using a one-time record that enables battery diagnostics. An excitation current to a battery is a sum of equal amplitude sine waves of frequencies that are octave harmonics spread over a range of interest. A sample frequency is also octave and harmonically related to all frequencies in the sum. The time profile of this signal has a duration that is a few periods of the lowest frequency. The voltage response of the battery, average deleted, is the impedance of the battery in the time domain. Since the excitation frequencies are known and octave and harmonically related, a simple algorithm, FST, processes the time record by rectifying relative to the sine and cosine of each frequency. Another algorithm yields real and imaginary components for each frequency.

12 Claims, 22 Drawing Sheets

U.S. PATENT DOCUMENTS

| | | | |
|---|---|---|---|
| 6,262,563 | B1 | 7/2001 | Champlin |
| 6,307,378 | B1 | 10/2001 | Kozlowski |
| 6,481,289 | B2 | 11/2002 | Dixon et al. |
| 6,653,817 | B2 | 11/2003 | Tate, Jr. et al. |
| 6,832,171 | B2 | 12/2004 | Barsoukov et al. |
| 7,065,474 | B2 * | 6/2006 | Petchenev et al. ............ 702/190 |
| 7,395,163 | B1 | 7/2008 | Morrison et al. |
| 7,616,003 | B2 | 11/2009 | Satoh et al. |
| 7,675,293 | B2 | 3/2010 | Christophersen et al. |
| 2003/0206021 | A1 * | 11/2003 | Laletin et al. ................. 324/426 |
| 2005/0127908 | A1 | 6/2005 | Schlicker et al. |
| 2005/0182584 | A1 | 8/2005 | Plusquellic |
| 2007/0257681 | A1 | 11/2007 | Christophersen et al. |
| 2008/0303528 | A1 | 12/2008 | Kim |
| 2010/0274510 | A1 | 10/2010 | Morrison et al. |
| 2010/0332165 | A1 | 12/2010 | Morrison et al. |

OTHER PUBLICATIONS

Ronald C. Fenton, BSM Development Documentation Senior Project Final Report for the Idaho National Laboratory, May 2005, Montana Tech of the University of Montana, 13 pages.

W. Morrison, Intelligent Self-Evolving Prognostic Fusion, Phase I STTR Interim Report, Jul. 2005, Qualtech Systems, Inc., 46 pages.

Weston, Albreht, Battery Complex Impedance Identification with Random Signal Techniques, 2005, Montana Tech of the University of Montana. 99 pages.

J. Morrison, Algorithms as MATLAB Code for Real Time Estimation of Battery Impedance, Sep. 2005, Montana Tech of the University of Montana, 21 pages.

R. E. Ziemer, W. H. Tranter, Principles of Communcations 5th edition, John Wiley & Sons, 2002, 11 pages.

P. D. Wasserman, Advanced Methods in Neural Computing, 1993, New York: Van Nostrand Reinhold. 31 pages.

Alpaydin, Introduction to Machine Learning, 2004, Cambridge, Mass., London, England, The MIT Press. 8 pages.

J. L. Morrison, W. H. Morrison, Real Time Estimation of Battery Impedance, IEEE Aerospace Conference, Mar. 5-11, 2006, Big Sky, MT, 13 pages Nikolopoulos, P. N., Accurate Method of Representation of High-Voltage Measuring Systems and its Application in High-Impulse-Voltage Measurements, Mar. 1989, 66-72, vol. 136, Science, Measurement and Technology, IEE Proceedings A, Dept. of Electr. Eng., Nat. Tech. Univ., Athens, Greece.

Smith, R., Banaszuk, A., Dullerud, G., Model Validation Approaches for Nonlinear Feedback Systems Using Frequency Response Measurements, Dec. 1999, 1500-1504, vol. xvii+5325, Decision and Control, Proceedings of the 38th IEEE Conference, Phoenix, AZ.

Jon P. Christophersen, Impedance Noise Identification for State-of-Health Prognostics, Jul. 7-10, 2008, Philadelphia, PA, 43rd Power Sources Conference, 4 pages.

Chapra, "Numerical Methods for Engineers," pp. 394-398, McGraw-Hill Publishing Company, 1985.

Christophersen et al., "Effects of Reference Performance Testing during Aging Using Commercial Lithium-ion Cells," J. Electrochem Soc., 153(7) 2006, pp. A2406-A1416.

Christophersen et al., Electrochemical Impedance Spectroscopy Testing on the Advanced Technology Development Program Lithium-ion Cells, 2002, IEEE Trans. Veh. Technol., pp. 1851-1855, 56(3).

Christophersen et al., "Lumped Parameter Modeling as a Predictive Tool for a Battery Status Monitor," Oct. 2003, Proceedings from IEEE Vehicular Technology Conference, 6 pages.

Mix, Dwight F., "Random Signal Processing," p. 296, Prentice Hall Publishing Company, 1995.

Morrison et al., "Fast Summation Transformation for Battery Impedance Identification," IEEE Aerospace 2009 Conference, Mar. 7-14, 2009, Big Sky, Montana, 9 pages.

PCT International Search Report and Written Opinion of the International Searching Authority for PCT/US2010/038401, dated Dec. 31, 2010, 8 pages.

PCT International Search Report and Written Opinion of the International Searching Authority for PCT/US2010/038358, dated Dec. 31, 2010, 8 pages.

PCT International Search Report and Written Opinion of the International Searching Authority for PCT/US11/35052, dated Jul. 26, 2011, 11 pages.

Ramos et al., Comparison of impedance measurements in a DSP using ellipse-fit and seven-parameter sine-fit algorithms, Measurement 42 (May 23, 2009) pp. 1370-1379. Retrieved online at <http://www.sciencedirect.com/science/article/pii/S0263224109001031>.

Ranade et al., An overview of harmonics modeling and simulation, Elect. Power Syst. Res. vol. 74, pp. 37-56, Apr. 2005, Retrieved online at <http://www.calvin.edu/~pribeiro/IEEE/ieee_cd/chapters/pdffiles/c1pdf.pdf>.

Smyth, Brian, "Development of a Real Time Battery Impedance Measuring System," M.S. Thesis Montana Tech of the University of Montana, 2008, 128 pages.

U.S. Appl. No. 13/100,184, filed May 3, 2011 to Christophersen et al., titled, "Crosstalk Compensation in Analysis of Energy Storage Devices."

U.S. Appl. No. 13/100,170, filed May 3, 2011 to Christophersen et al., titled, "In-Situ Real-Time Energy Storage Device Impedance Identification."

* cited by examiner

METHOD OF DETECTING SYSTEM FUNCTION BY MEASURING FREQUENCY RESPONSE

CROSS-REFERENCE TO RELATED APPLICATIONS

This application is a continuation-in-part of U.S. patent application Ser. No. 11/825,629, filed Jul. 5, 2007, now U.S. Pat. No. 7,395,163, issued Jul. 1, 2008, which is a continuation of U.S. patent application Ser. No. 11/313,546, filed Dec. 20, 2005, now abandoned, which claims the benefit of U.S. Provisional Patent Application Nos. 60/637,969, filed Dec. 20, 2004, and 60/724,631, filed Oct. 7, 2005. The disclosure of each of these applications are hereby incorporated by reference in their entirety, including all figures, tables and drawings.

STATEMENT REGARDING FEDERALLY SPONSORED RESEARCH OR DEVELOPMENT

The subject invention was made with government support under a research project supported by NASA, Grant No. NNA05AC24C. The government has certain rights in this invention. Further, the United States Government has certain rights in this invention pursuant to Contract No. DE-AC07-05ID14517 between the United States Department of Energy and Battelle Energy Alliance, LLC.

BACKGROUND OF THE INVENTION

Electrochemical Impedance Measurement Systems use the Bode analysis technique to characterize an impedance of an electrochemical process. It is a well-established and proven technique. A battery being evaluated is excited with a current that is a single frequency and its response is measured. The process is repeated over a range of frequencies of interest until the spectrum of the impedance is obtained. The method is effective but time consuming, as the process is serial. A parallel approach using band width limited noise as an excitation current can obtain the same information in less time. The system response to the noise is processed via correlation and Fast Fourier Transform (FFT) algorithms and many such responses are averaged. The result is the spectrum of response over the desired frequency range. The averaging of many responses also makes this process somewhat serial. Another technique assembles the current noise waveform from a sum of sinusoids, each at a different frequency. The system response as a time record is acquired and processed with the FFT algorithm. To reduce noise, multiple time records of waveforms are processed and their resultant spectra averaged. This process is also serial.

There remains a need for real-time acquisition of battery impedance for control and diagnostics over a limited frequency range. This method of acquisition should be a true parallel approach that uses a single time record of battery response with a duration compatible with a real-time control process.

BRIEF SUMMARY OF THE INVENTION

The invention involves using a parallel approach to analyze battery impedance or other system functions. A number of frequencies are selected over which the battery is to be tested. These frequencies are assembled into an Excitation Time Record (ETR) that is the Sum of the Sinusoids (SOS) of the frequencies and the length of such periods of the lowest of the frequencies. The ETR is conditioned to be compatible with the battery. The battery is then excited with the ETR and a Response Time Record (RTR) is captured. The RTR is then synchronized to the ETR and processed by a series of equations to obtain frequency response.

In one preferred embodiment, the RTR is processed to obtain estimated frequency components of magnitude and phase for one of the selected frequencies. Processing is repeated to obtain estimated frequency components for each selected frequency. Frequency components are reassembled to obtain an Estimated Time Record (ETR). The ETR is subtracted from the captured RTR to get an error. The error is minimized to achieve the frequency response estimate. Error is minimized using Compensated Synchronous Detection (CSD) using a CSD algorithm, which can be implemented by a neural network.

In another preferred embodiment, all excitation frequencies of the SOS are harmonics by powers of two. The sample period likewise is a power of two with all the SOS frequencies. The RTR is rectified relative to a square wave and a 90-degree shifted square wave of one of the SOS frequencies. Integrating the processed RTR results in an "in phase" and "quadrature" sum that is easily processed to yield the magnitude and phase shift of the desired frequency components. Frequency components are assembled to obtain frequency response.

The subject method allows a parallel implementation for swept frequency measurements to be made utilizing a composite signal of a single time record that greatly reduces testing time without a significant loss of accuracy.

DETAILED DESCRIPTION OF THE INVENTION

The method of the subject invention allows for real time estimation of a battery's impedance spectrum. The shift of a battery's impedance spectrum strongly correlates to the health of the battery. Therefore, the subject method provides in-situ diagnostics for state-of-health estimation of the battery, which is critical for enhancing the overall application's reliability. The subject method measures a frequency response of a unit under test, for example, a battery. The battery under test is excited by the sum of sinusoids of a number of test frequencies. A response time record is captured, then processed, to obtain estimates of frequency components for each of the number of frequencies. Estimated frequency components are assembled to achieve a frequency response.

Figure 23:
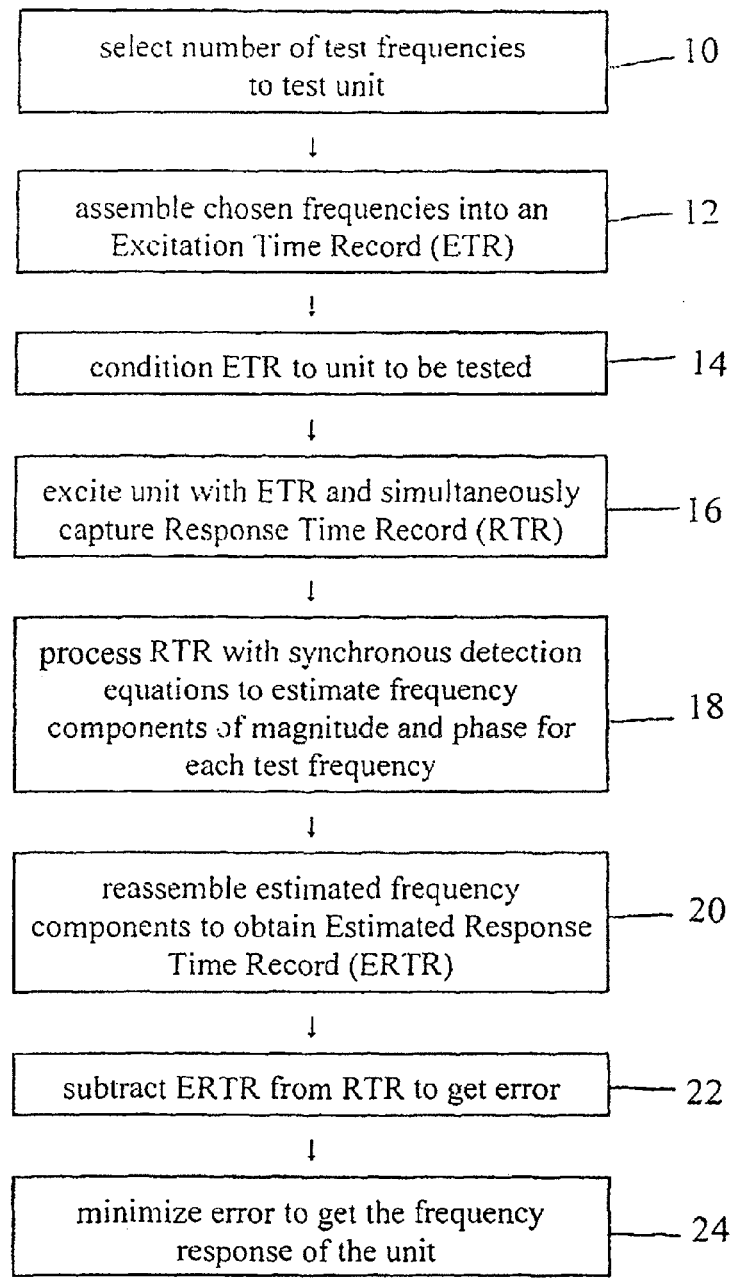
FIG. 23 is a flow chart showing a preferred method of the invention.

A system function can be identified over a limited number of specific frequencies at step 10 as shown in the flow chart of FIG. 23. The desired frequencies are assembled as an excitation time record 12 that is a sum of those sinusoids and have a length of several periods of the lowest frequency. The time step selected must be compatible with Shannon's sampling constraints for the highest frequency component. The individual waveforms should be sine waves of equal amplitude but alternating signs for a phase shift of 180 degrees between the components. Alternating the 180-degree phase shift will minimize a start-up transient. The Root Mean Square (RMS) and the rogue wave peak (sum of the absolute values of all component peaks) of the assembled time record must be compatible with the system being excited and the Data Acquisition System (DAS) that will capture the response.

The Excitation Time Record (ETR), as a current for impedance identification or voltage for system function identification, is signal conditioned 14 to be compatible with the Unit Under Test (UUT). As part of the signal conditioning, anti-aliasing filters ensure that all frequencies generated by the digital-to-analog conversion process other than the intended frequencies are suppressed. The UUT is excited 16 by the ETR and a time record of the UUT response is captured by the DAS. The UUT Response Time Record (URTR) is synchronized to, and the same length as, the ETR.

A preferred embodiment of the processing of the response time record is described below. In order to fit steady-state sinusoidal response assumptions, a preselected number of data points R at the beginning of the URTR must be discarded. In general, the sum of those data points total to a time that is larger than the transient response time of the UUT at the front end of the ETR. The UUT corrected time response is referred to as the CTR.

In order to fit steady-state sinusoidal response assumptions, a preselected number of data points, R, at the beginning of the URTR must be discarded. In general, the sum of those data points total to a time that is larger than the transient response time of the UUT at the front end of the ETR. The UUT Corrected Time Response is referred to as the CTR.

The first estimate of components, magnitude, and phase of the frequency response is made by processing 18 the URTR via Equations 3 through 10. It is important that a zero mean be established prior to processing with Equations 3 to 10 (see below).

The core of this whole concept is that an estimate of the UUT Corrected Time Response, the CTR, is made by reassembling 20 the CTR using the estimates of the individual frequency components with the same time step and then discarding the first R time steps to become the ECTR. The difference between the CTR and the ECTR is an error 22 and minimizing 24 this error will increase the accuracy of the frequency response estimates.

A first approach to minimizing the error between the CTR and the ECTR is Compensated Synchronous Detection (CSD). The CSD algorithm synthesizes a residual time record of the original time record using the magnitudes of the in-phase and quadrature components for each frequency, except the one to be detected. This synthesized residual is then subtracted from the original time record. The resulting compensated time record is processed with synchronous detection and a new compensated estimate of the response at the detection frequency is obtained. Since all of the other components in this compensated time record are suppressed, the error from leakage at those other frequencies is less. This process is repeated for each of the frequencies. Assembling the residual time record and generating the compensated time record are illustrated by Equations 11 and 12 (see below).

Another approach to minimize the error between the CTR and the ECTR is to use a neural network. A first estimate of the component magnitudes and phases is made as described for the CSD technique. Those values are stored and the ECTR is calculated. This signal is then subtracted from the CTR to produce a response residual. The synchronous detection is then performed upon this residual and the component magnitudes and phases are again stored. These components are then used to reconstruct an estimate of the residual signal. This estimated residual signal is subtracted from the initial residual signal to produce a residual, residual signal. This is then synchronously detected and the loop starts again. This is repeated as many times as desired, each time with the resultant components being stored. The assumption is that there is a functional relationship between these resultant components and a true system response. A neural network is then used to determine this relationship. The previously stored results become the test dataset for the neural network. The network has been trained previously on a similar unit and a known ideal response (e.g., battery impedance measured using electrochemical impedance spectroscopy). The output of the network is the estimate of the response.

A further step of the subject method is to shift the complete set of desired frequencies and to repeat the whole process. This step could be repeated many times with different shifts to develop a high-resolution frequency response that for battery impedance could be comparable to that provided by electrochemical impedance spectroscopy. Thus, the subject method can provide capability for both limited frequency response in real-time or high-resolution frequency response not in real-time for periodic system in-depth diagnostics.

The system of the subject invention is based on the following theoretical design. The Unit Under Test (UUT) is excited with a limited sum of sinusoids, each at a different frequency that is spread over the range of interest. The magnitude, frequency and phase of each sinusoid making up the sum are known. If a total response of the system is measured via a sample data system at an acceptable sample rate and an adequate duration time record is acquired, then a simple algorithm that uses the known magnitude, frequency and phase of each individual sinusoid will process the single time record. This analysis will obtain the true Bode response at the selected frequencies spread over the range of interest all in parallel. The following synchronous detection analysis is the basis of this simple algorithm. The reference waveform is chosen as a sine, as at time zero everything will be at zero.

Equation 1 gives the relationship for a parallel excitation.

$$f_{in}(t) = \sum_{i=1}^{M} A_i \sin(\omega_i t + \phi in_i) \quad (1)$$

Equation 2 gives the measured sampled data response of the system $$f_{Out}[j] = \sum_{i=1}^{M} B_i \sin(\omega_i (j-1)\Delta t + \phi out_i); \quad j = 1:N \quad (2)$$

Where:
$A_i$ is the amplitude of the $i^{th}$ input sinusoid
$B_i$ is the amplitude response of the $i^{th}$ output sinusoid
$\omega_i$ is the radian frequency of the $i^{th}$ sinusoid
$\Delta t$ is the time step of data system
$\phi in_i$ is the phase of the $i^{th}$ input sinusoid
$\phi out_i$ is the phase response of the $i^{th}$ output sinusoid N is the number of points of the response time record
M is the number of different sinusoids of the excitation time record Each component magnitude and phase of the system response at all the excitation frequencies can be obtained via the following synchronous detection analysis. This analysis quantifies the response at the $k^{th}$ radian frequency $\omega_k$ with the "in phase" and "quadrature" response. The analysis incorporates a feature of discarding a preselected number of points R at the beginning of the system response in order to meet the assumption of steady-state sinusoidal response. Additionally, for most applications, prior to processing the data, the mean of the acquired time record should be computed and deleted. The presence of a non-zero mean could corrupt an estimate of the lowest frequency component.

In phase:

$$F_{out_K} = \frac{1}{N-R} \sum_{j=R+1}^{N} \left\{ A_K \sin(\omega_K(j-1)\Delta t + \phi in_K) \sum_{i=1}^{M} B_i \sin(\omega_i(j-1)\Delta t + \phi out_i) \right\} \quad (3)$$

$$F_{out_K} = \frac{1}{N-R} \sum_{j=R+1}^{N} \left\{ \frac{A_K B_K}{2} [\cos(\phi in_K - \phi out_K) - \cos(2\omega_K(j-1)\Delta t + \phi in_K + \phi out_K)] + \sum_{i \neq k=1}^{M} \frac{A_K B_i}{2} [\cos((\omega_k - \omega_i)(j-1)\Delta t + \phi in_K - \phi out_i) - \cos((\omega_k + \omega_i)(j-1)\Delta t + \phi in_K + \phi out_i)] \right\} \quad (4)$$

$$F_{out_K} = \frac{A_K B_K}{2} \cos(\phi in_K - \phi out_K) \quad (5)$$

If the time record were infinite, the summation over j would average everything to zero except the final result of Equation 5. The quadrature analysis follows in the same way.

Quadrature:

$$Fq_{out_K} = \frac{1}{N-R} \sum_{j=R+1}^{N} \left\{ A_K \cos(\omega_K(j-1)\Delta t + \phi in_K) \sum_{i=1}^{M} B_i \sin(\omega_i(j-1)\Delta t + \phi out_i) \right\} \quad (6)$$

$$Fq_{out_K} = \frac{1}{N-R} \sum_{j=R+1}^{N} \left\{ \frac{A_K B_K}{2} [\sin(\phi out_K - \phi in_K) + \sin(2\omega_K(j-1)\Delta t + \phi in_K + \phi out_K)] + \sum_{i \neq k=1}^{M} \frac{A_K B_i}{2} [\sin((\omega_k + \omega_i)(j-1)\Delta t + \phi in_K + \phi out_i) - \sin((\omega_k - \omega_i)(j-1)\Delta t + \phi in_K - \phi out_i)] \right\} \quad (7)$$

$$Fq_{out_K} = \frac{A_K B_K}{2} \sin(\phi out_K - \phi in_K) \quad (8)$$

Again, the summation over j for infinite time record averages everything to zero except the final result of Equation 8.

Equations 5 and 8 can be combined to give magnitude and phase for the $k^{th}$ frequency response.

$$|F_{out_K}| = \sqrt{f_{out_K}^2 + fq_{out_K}^2} = \quad (9)$$

$$\frac{A_K B_K}{2} \underbrace{\sqrt{\sin^2(\phi in_K - \phi out_K) + \cos^2(\phi in_K - \phi out_K)}}_{=1} = \frac{A_K B_K}{2}$$

$$\Box F_{out_K} = \tan^{-1}\left(\frac{Fq_{out_K}}{F_{out_K}}\right) = \tan^{-1}\left(\frac{\frac{A_K B_K}{2}\sin(\phi out_K - \phi in_K)}{\frac{A_K B_K}{2}\cos(\phi out_K - \phi in_K)}\right) = \quad (10)$$

$$\tan^{-1}\left(\frac{\sin(\phi out_K - \phi in_K)}{\cos(\phi out_K - \phi in_K)}\right) = (\phi out_K - \phi in_K)$$

Equations 9 and 10 give the final results for synchronous detection. This process is repeated for all M of the excitation sinusoids. As stated, the results depend on the time record being infinite in duration. This is not the case and, thus, the results are in error by leakage from the other components. This error can be reduced without increasing the time record using the following algorithm for Compensated Synchronous Detection (CSD).

The CSD algorithm synthesizes a residual time record of the original time record using the magnitudes of the in-phase and quadrature components for each frequency except the one to be detected. This synthesized residual is then subtracted from the original time record. The resulting compensated time record is then processed with synchronous detection, and a new compensated estimate of the response at the detection frequency is obtained. Since all of the other components in this compensated time record are suppressed, the error from leakage at those other frequencies will be less. This process is repeated for each of the frequencies. Assembling a residual time record and generating the compensated time record are illustrated by Equations 11 and 12.

$$f_{RK}[j] = \sum_{p=1, p \neq K}^{M} (F_p \sin(\omega_p(j-1)\Delta t) + F_{Qp}\cos(\omega_p(j-1)\Delta t)); \quad (11)$$

$$j = R + 1 : N$$

$$Cf_{Kout}[j] = f_{Out}[j] - f_{RK}[j] \quad (12)$$

Where:
- $f_{out}$ is the original time record
- $f_{RK}$ is the correction time record
- $Cf_{KOut}$ is the compensated time record
- $F_P$ is the estimated in phase amplitude response at the $p^{th}$ frequency
- $F_{Qp}$ is the estimated quadrature amplitude response at the $p^{th}$ frequency
- $\omega_p$ is the radian frequency of the $p^{th}$ sinusoid
- $\Delta t$ is the time step of the data system
- N is the number of points of the output time record
- M is the number of different sinusoids of the excitation function
- R is the number of points of the output time record that are discarded The synchronous detection algorithm described by Equations 1 through 8 is applied to the compensated time record of Equation 12 and better estimates of $F_P$ and $F_{Qp}$ are obtained. This process can be repeated again until the total difference between a completely synthesized time record response and the original time record is minimized.

The following examples are offered to illustrate the method of the subject invention and should not be construed as limiting.

Example 1

Analytical Testing on a Sum of Sines

The CSD algorithm was evaluated using a simple signal that was assembled from a finite sum of equal amplitude sine waves (Sum of Sines (SOS)) with frequencies distributed logarithmically over a limited range. The objective of the analysis was to assess how well the CSD algorithm could pick out an amplitude for each component.

To check out the concept analytically, a MATLAB® matrix calculation computer software code was written that was a logarithmic mix of 5 equal unity amplitude frequencies ($5^{0.5}$, $5^1$, $5^{1.5}$, $5^2$, $5^{2.5}$ Hz). The acquired time record was set to 10 periods of the lowest frequency and the time step was set to $\frac{1}{10}$ of the period of the highest frequency. As per Equation 9, error-free detection should estimate the amplitude of 0.5 for each component. Table 1 gives an estimate for a first pass or simple synchronous detection and a second pass, the CSD algorithm. The MATLAB® matrix calculation computer software code for this analysis is disclosed by Morrison et al., 2005, Algorithms as MATLAB Code for Real time Estimation of Battery Impedance.

TABLE 1

| Compensation algorithm analytical results | | | | | |
|---|---|---|---|---|---|
| | Frequency | | | | |
| | $5^{.5}$ | $5^1$ | $5^{1.5}$ | $5^2$ | $5^{2.5}$ |
| 1st Pass (Simple Synchronous Detection) | | | | | |
| Amplitude | 0.5060 | 0.5060 | 0.4975 | 0.4988 | 0.5008 |
| 2nd Pass (CSD Algorithm) | | | | | |
| Amplitude | 0.5004 | 0.4998 | 0.5004 | 0.5000 | 0.5003 |

As seen in Table 1 analytically, the compensation technique does appear to work as the error for the second pass is much reduced. This initial check of the concept was applied to detect amplitude only and not phase detection. The signal is a sum of equal amplitude sine waves being decomposed into the individual components by the algorithm.

Example 2

Analytical Testing of a Low-Pass Filter

A recursive model of a second order low-pass function was excited with an SOS input signal. The CSD algorithm was then used to estimate the frequency response at each of the specific frequencies making up the SOS.

A spread of 13 specific frequencies was chosen that were spaced in ¼ decade steps starting from 0.1 Hz up to 100 Hz. Using these frequencies, a mix of equal unity amplitude sine waves was created. This range of frequencies was picked as research performed at the Idaho National Laboratory with batteries is typically over this frequency spread. The signal was discretized with a time step that was 10% of the period of the highest frequency. The length of the time record was set at 10 periods of the lowest frequency.

A recursive model of a second order Butterworth low-pass function was developed. A center frequency was set at the middle of the SOS frequency spread. A filter response to the SOS input time profile was computed.

Figure 1:
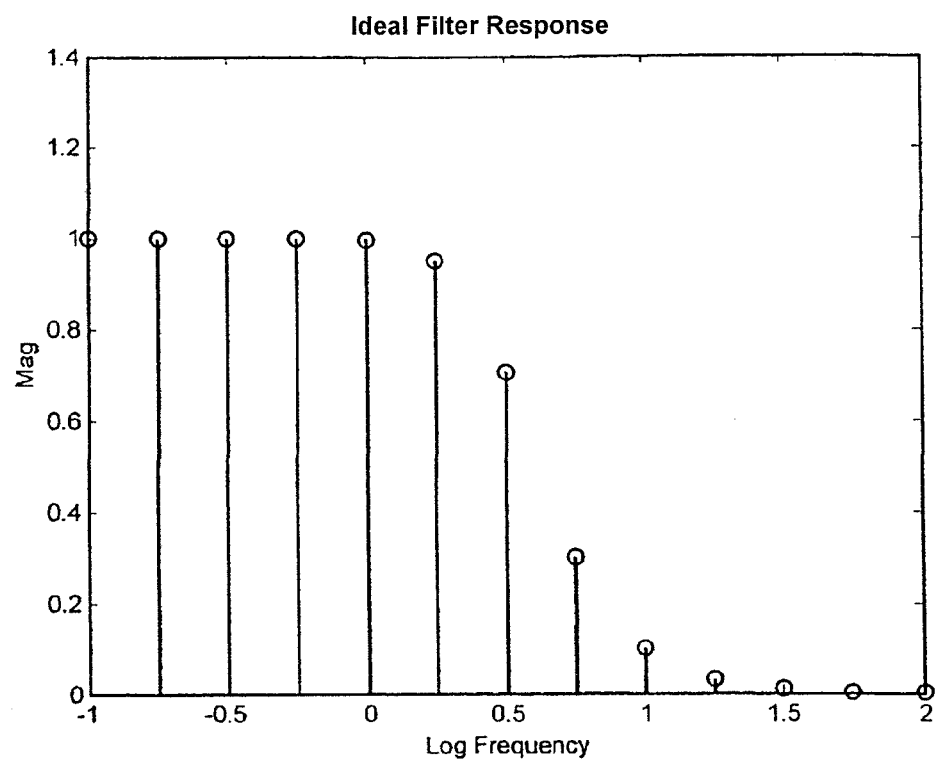
FIG. 1 shows a Filter Ideal Magnitude Response.
Figure 2:
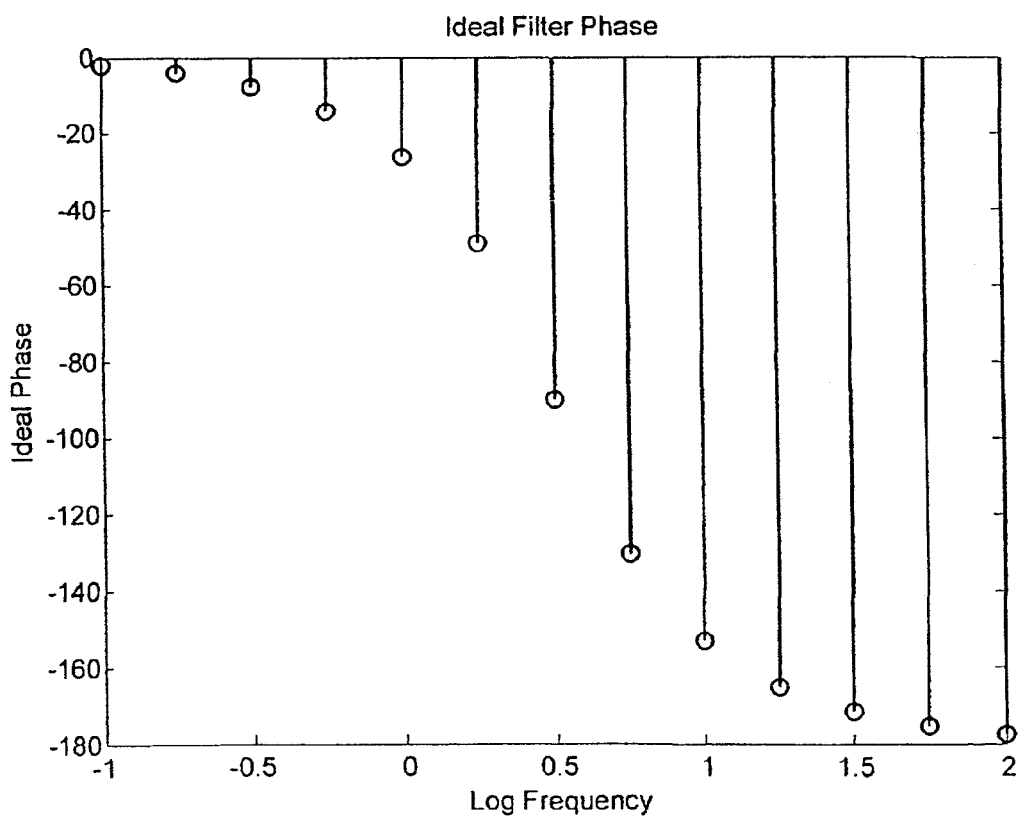
FIG. 2 shows a Filter Ideal Phase Response.
Figure 3:
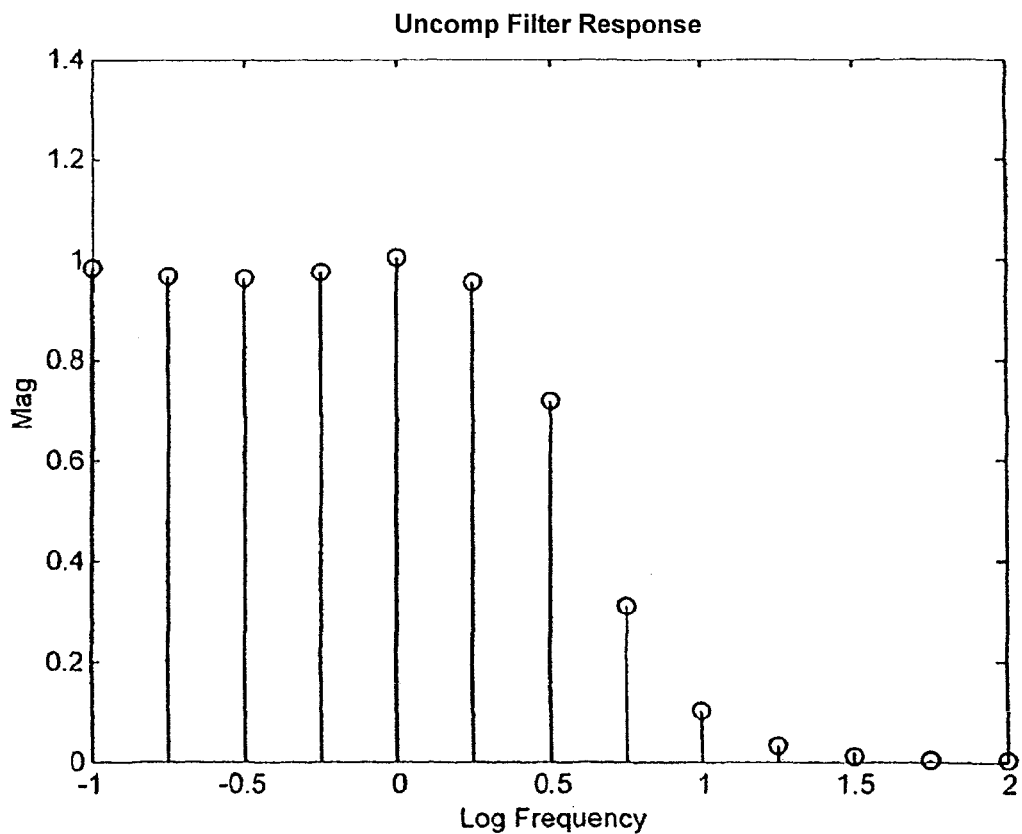
FIG. 3 shows a Filter Uncompensated Synchronous Detected Magnitude Response.
Figure 4:
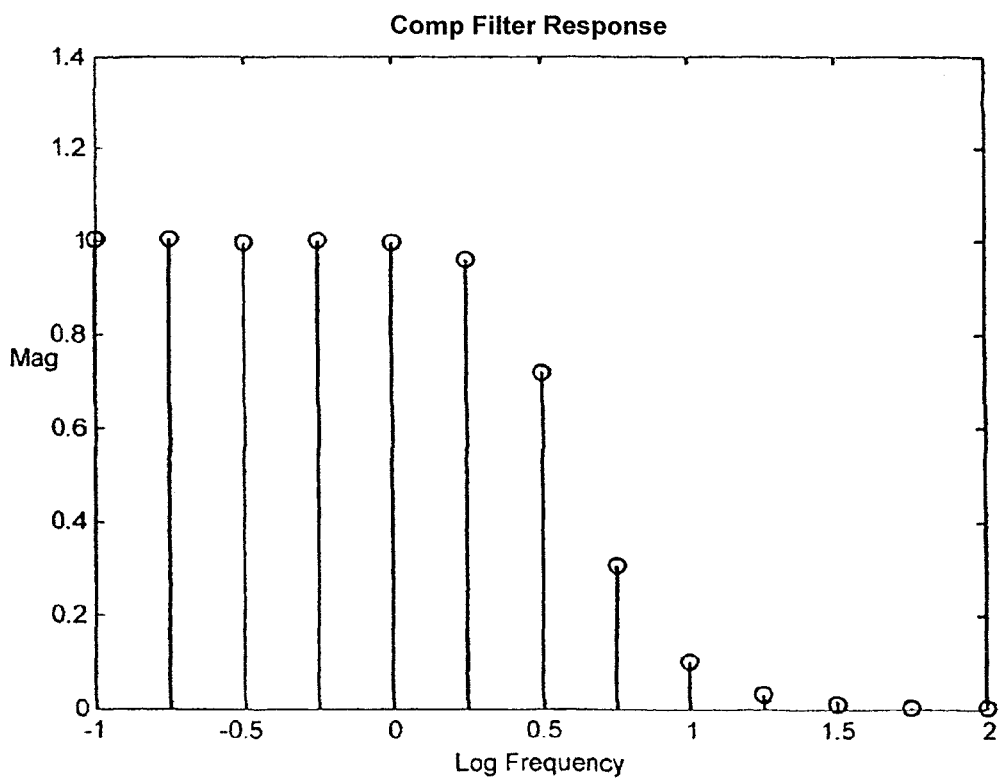
FIG. 4 shows a Filter Compensated Synchronous Detection (CSD) Magnitude Response.
Figure 5:
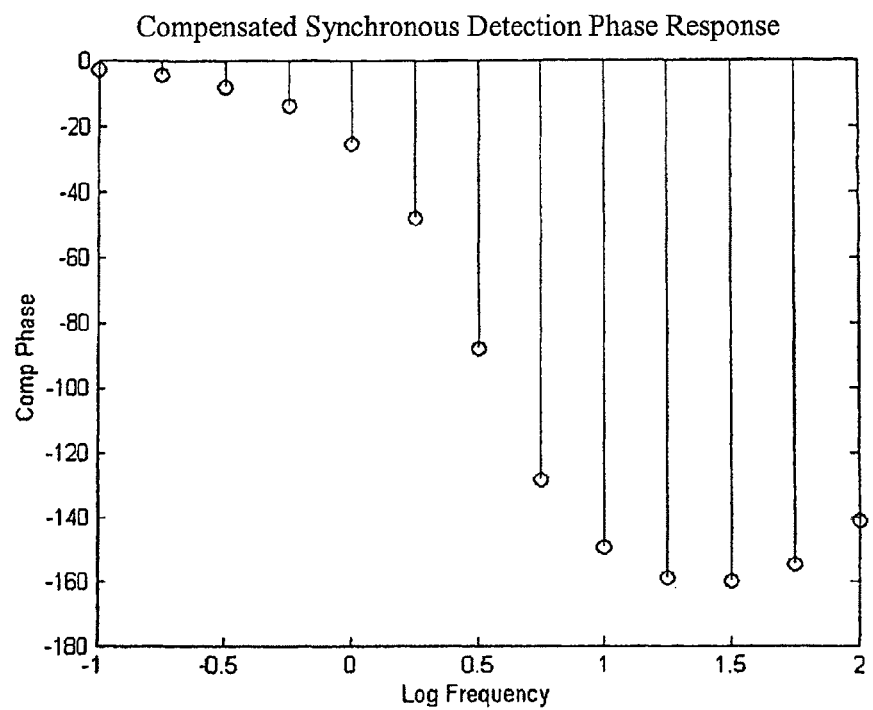
FIG. 5 shows a Filter CSD Phase Response.

Finally, the CSD code was developed to estimate the filter frequency response from the time profile generated by the recursive model code. That code is the implementation of Equations 1 through 12. Additionally, the implementation has the ability to discard a number of user-selected points at the beginning of the time profile such that the remaining data better fits the assumption of "steady-state" response. The following 6 figures are MATLAB® matrix calculation computer software discrete plots of an ideal frequency response, an uncompensated frequency response, and finally, a compensated frequency response. All 3 have a magnitude plotted against a Log of frequency. FIGS. 1 and 2 are an ideal magnitude and phase response. FIG. 3 is an uncompensated magnitude response, while FIG. 4 is a compensated magnitude response. The improvement seen by comparing the last two figures is clear FIG. 5 is the compensated phase response. Error at the higher frequencies for the compensated result is likely due to processing a small signal at the high frequencies relative to larger signals at the lower frequencies. The net result is that the one-time record yields a limited number of points for both magnitude and phase. This technique shows promise for real-time applications. The MATLAB® matrix calculation computer software code for this analysis is disclosed by Morrison et al., 2005, Algorithms as MATLAB Code for Real time Estimation of Battery Impedance. The next approach will apply the concept analytically in an attempt to identify the impedance of a computer model of a battery.

Example 3

Analytical Testing of CSD with a Battery Model

Figure 6:
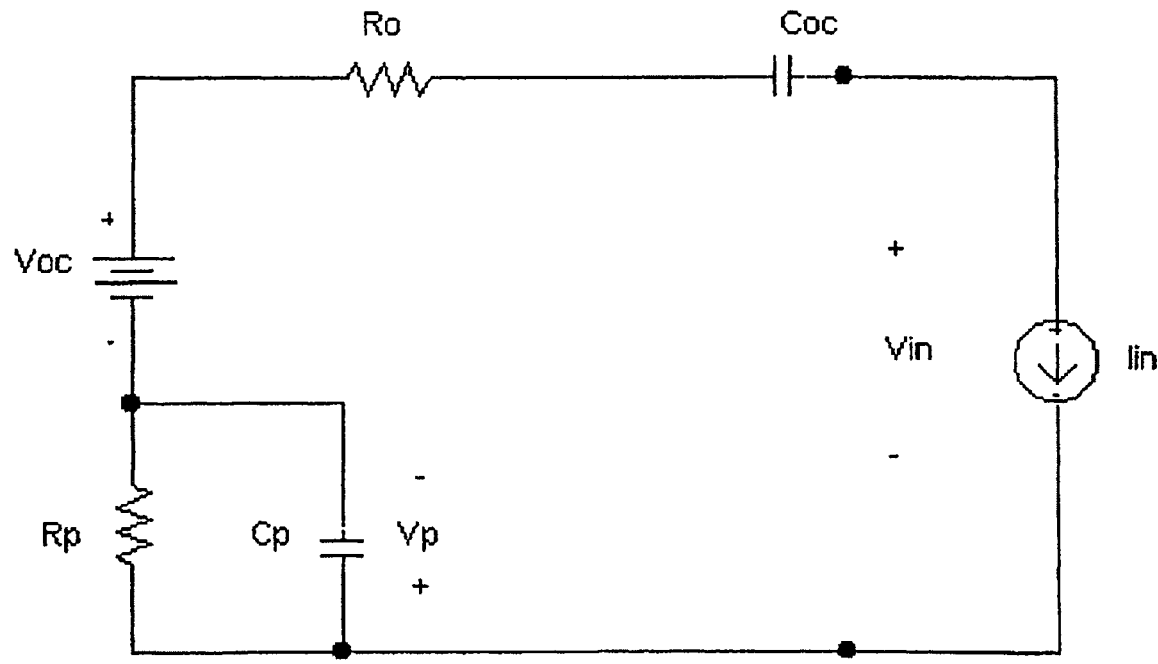
FIG. 6 shows a Lumped Parameter Model (LPM).

The CSD algorithm was evaluated analytically via a computer simulation of the detection of the impedance of the Lumped Parameter Model of a battery (LPM) that was developed by the Idaho National Laboratory (INL) (see, FreedomCAR Battery Test Manual, 2003). A computer model for the LPM that will simulate battery voltage response to an arbitrary battery current was also developed at INL by Fenton et al., 2005. The voltage response of the model normalized to the current in the frequency domain will be the battery impedance. The equivalent circuit for the LPM with parameter identification is shown in FIG. 6.

The LPM was excited with a current source $I_{IN}$ that was an SOS, and the CSD algorithm was used to identify the impedance seen looking into the LPM over a limited range of discrete frequencies. It should be noted that the polarity of the voltage response was defined as negative because the SOS excitation current was a discharge (negative relative to impedance). The CSD algorithm was used to obtain the frequency response of the LPM. The CSD response magnitude and phase were compared to the ideal response. Initially, the algorithm failed to match ideal impedance. The response of a battery terminal voltage to a discharge SOS current signal will contain a DC term caused by the DC battery voltage. Synchronous detection of any specific frequency in the response will cause a noise frequency in the resultant spectrum at the frequency being detected, at an amplitude of the product of the DC battery voltage, and an amplitude of the detection signal. That noise amplitude will be large relative to the signal being detected. Averaging enough cycles in the resultant time record will reject this noise. However, for a real-time application, the length of the time record needs to be short and not long. The problem was resolved when the mean was deleted from the prediction response of the LPM. The number of frequency lines was set to 13 and were logarithmically spread from 0.01 Hz to 1.0 Hz. The time record was set to 10 periods of the lowest frequency. In the CSD algorithm, no data points were discarded. Table 2 gives analysis specifics with LPM data that is typical for some lithium batteries that INL had recently tested. INL performed the testing per methods in the FreedomCAR Battery Test Manual, 2003.

TABLE 2

Representative LPM and Analysis Data

| | |
|---|---|
| Voc = 3.8 | |
| Cp = 666.6667 | At Rest |
| Coc = 1.6667e+003 | At Rest |
| Ro = 0.0250 | |
| Rp = .0150 | |
| M = 13 | Number of frequency lines |
| Dt = .01 | Time step, sec |
| N = 100000 | Total number of points |
| F = .01 | Starting Frequency, Hz |
| FF = 10 | Frequency spread in decades |
| S = .125 | Step size (log) over the decades, 8 steps per decade |
| NN = 10 | Length of time record in number of periods of lowest frequency |

Figure 7:
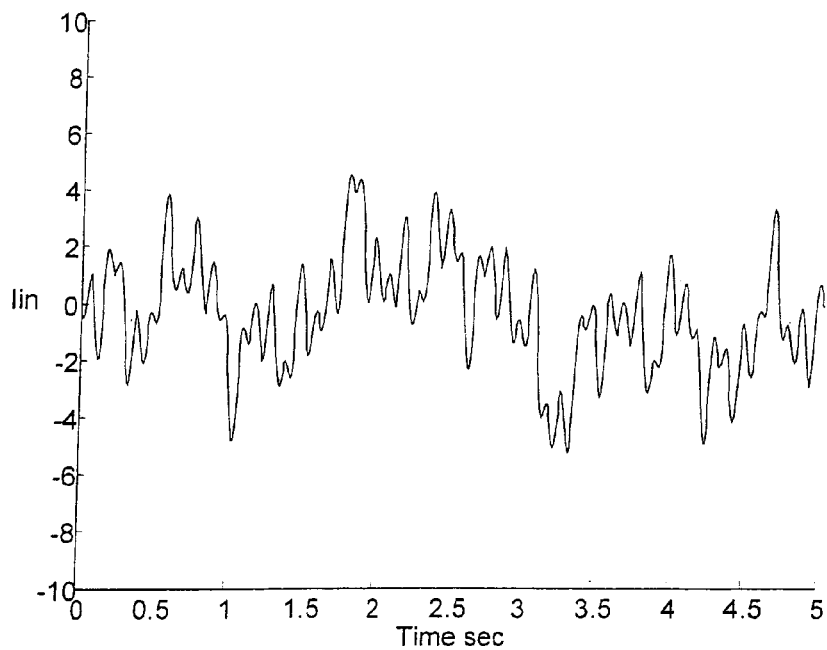
FIG. 7 shows a portion of a Sum of Sines (SOS) signal to LPM, 13 lines, 10 periods.
Figure 8:
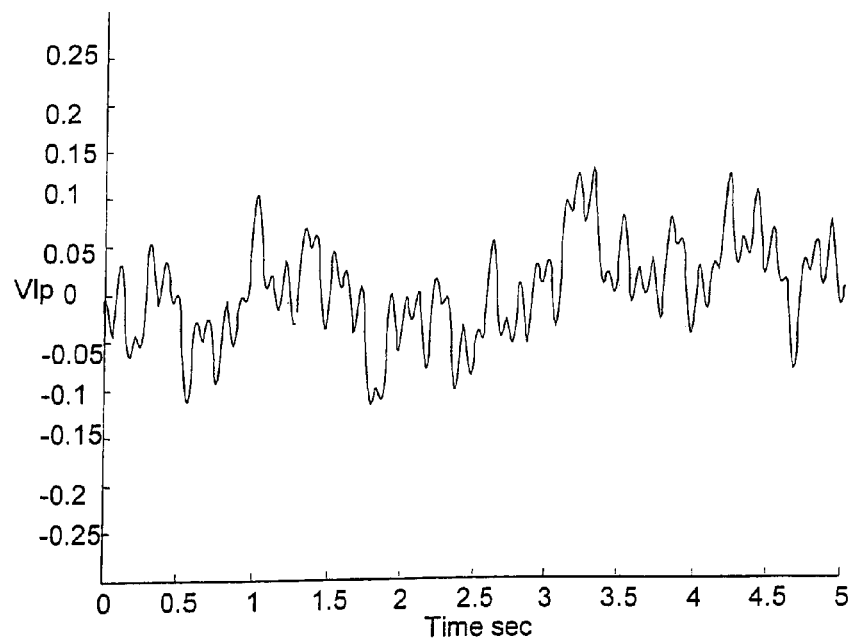
FIG. 8 shows a portion of an LPM time response, 13 lines, 10 periods.
Figure 9:
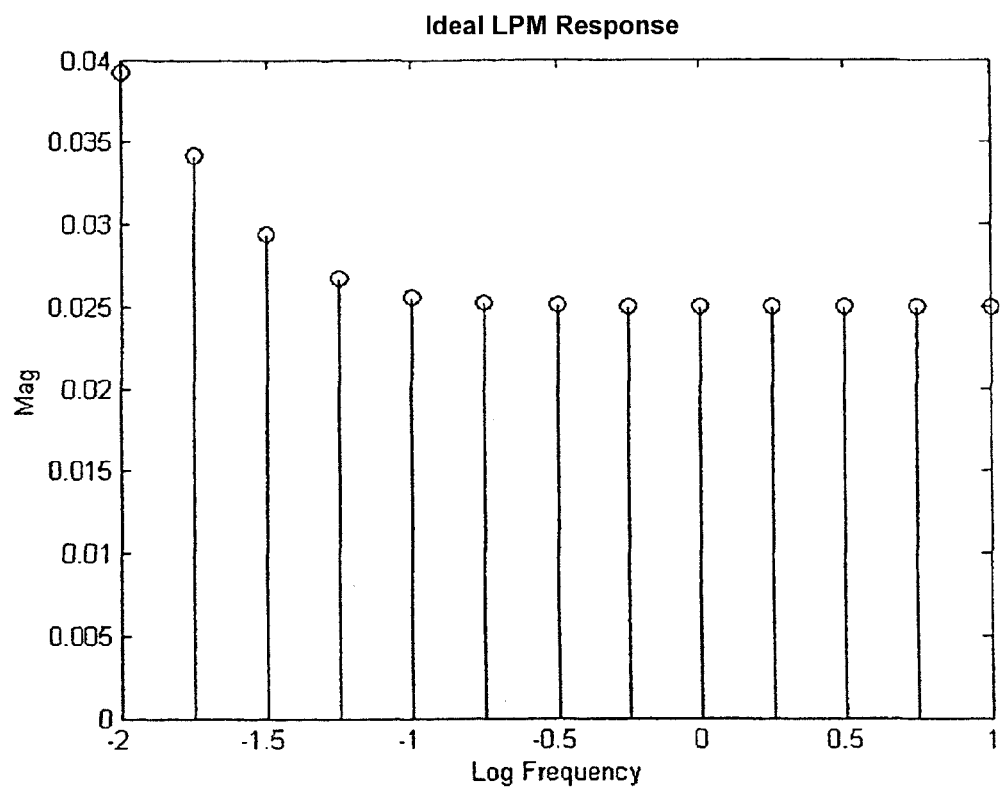
FIG. 9 shows an LPM ideal magnitude response, 13 lines, 10 periods.
Figure 10:
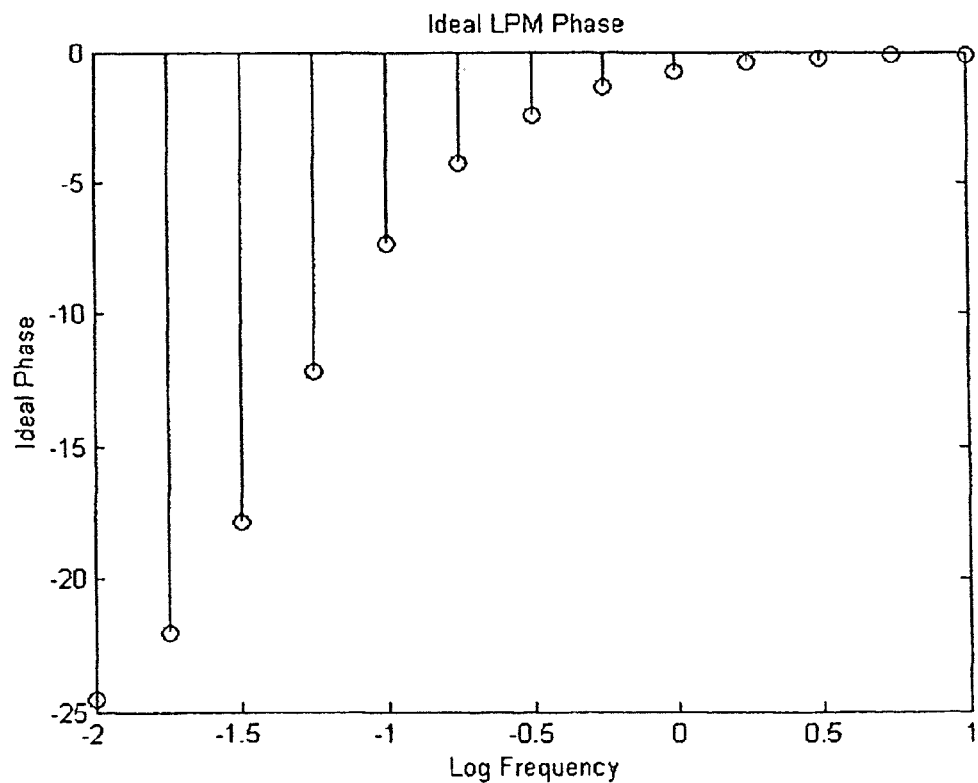
FIG. 10 shows an LPM ideal phase response, 13 lines, 10 periods.
Figure 11:
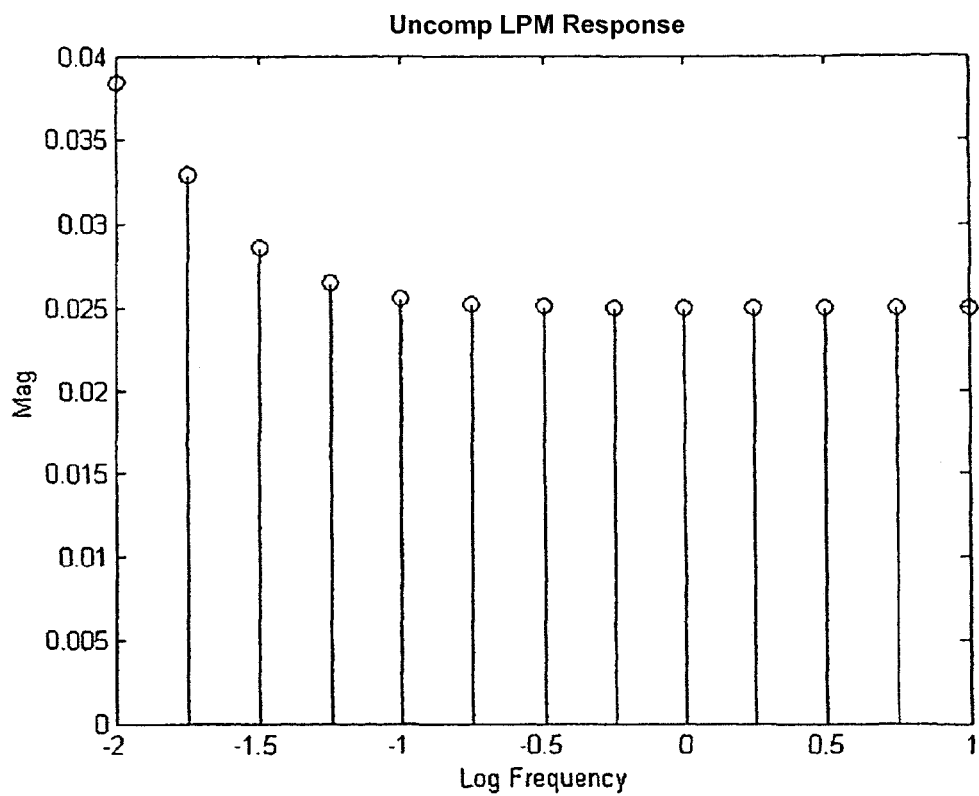
FIG. 11 shows an LPM uncompensated magnitude response, 13 lines, 10 periods.
Figure 12:
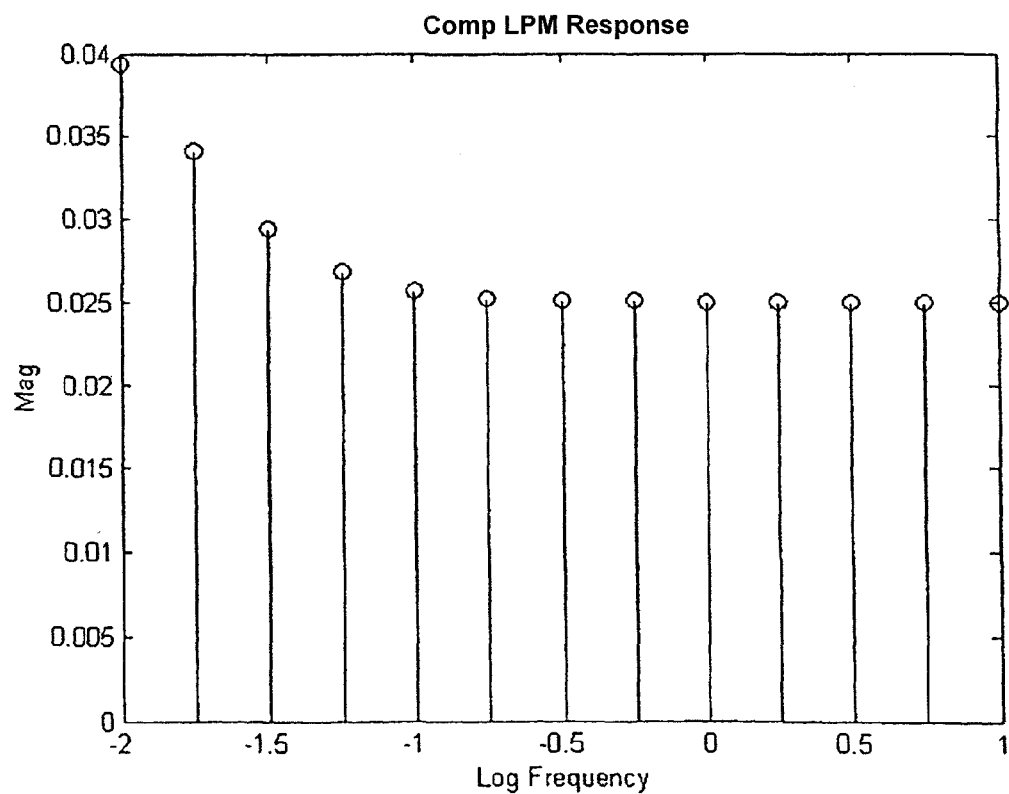
FIG. 12 shows an LPM CSD magnitude response, 13 lines, 10 periods.
Figure 13:
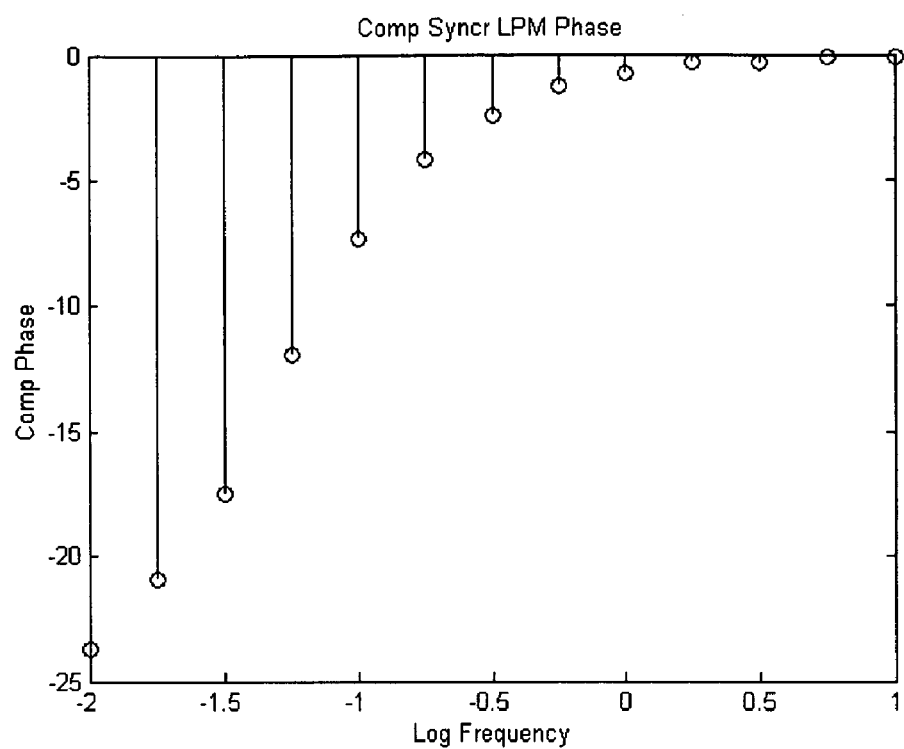
FIG. 13 shows an LPM CSD phase response, 13 lines, 10 periods.

The following 7 figures are the plots of the analysis results. FIG. 7 is the time record of the SOS current signal. FIG. 8 is the time record of the LPM voltage response. FIGS. 9 and 10 are the LPM ideal impedance magnitude and phase. FIGS. 11 and 12 are the uncompensated and the compensated magnitude response. FIG. 13 is the compensated phase response.

Figure 14:
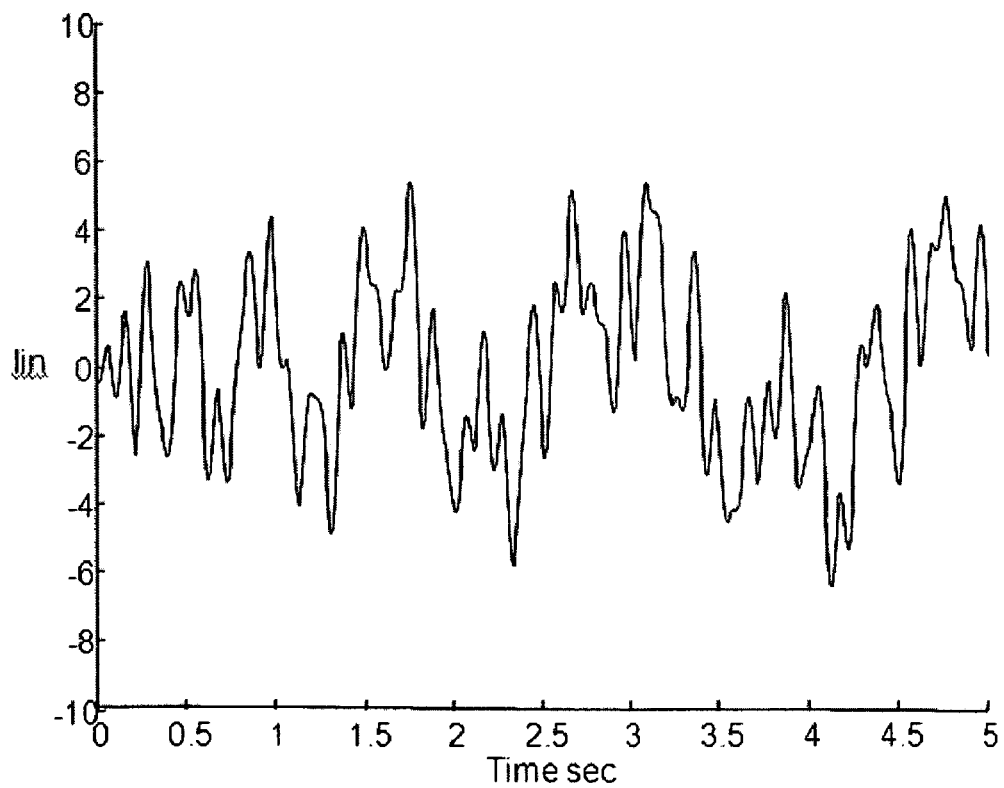
FIG. 14 shows a portion of an LPM SOS signal, 25 lines, 10 periods.
Figure 15:
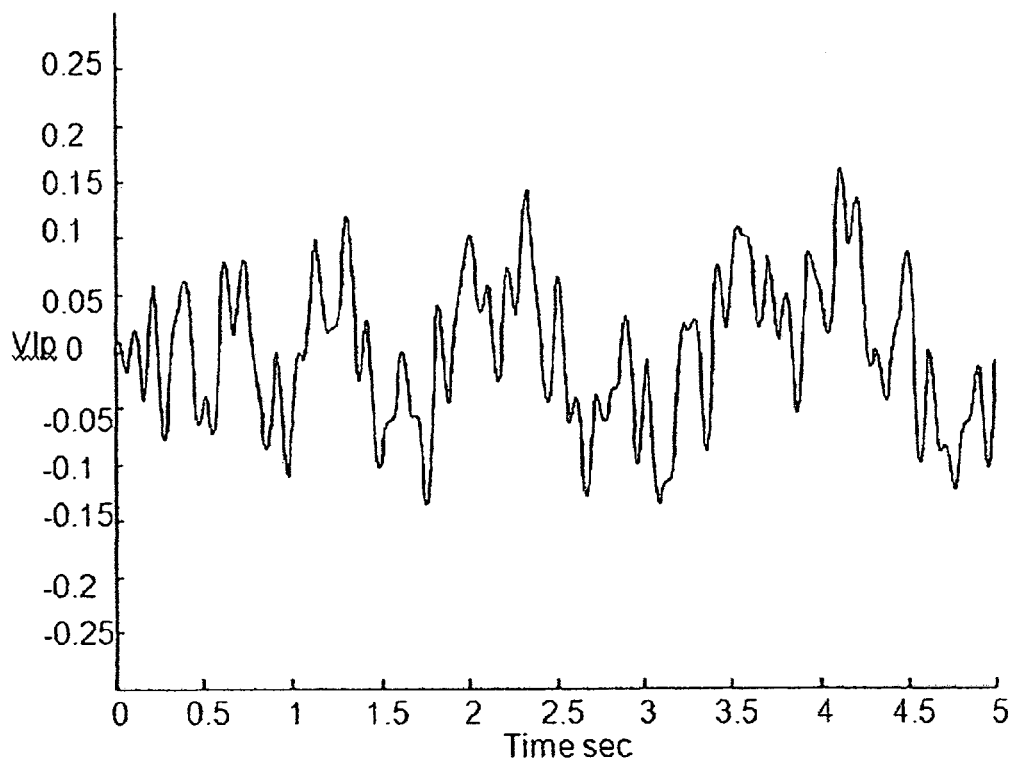
FIG. 15 shows a portion of an LPM time response, 25 lines, 10 periods.
Figure 16:
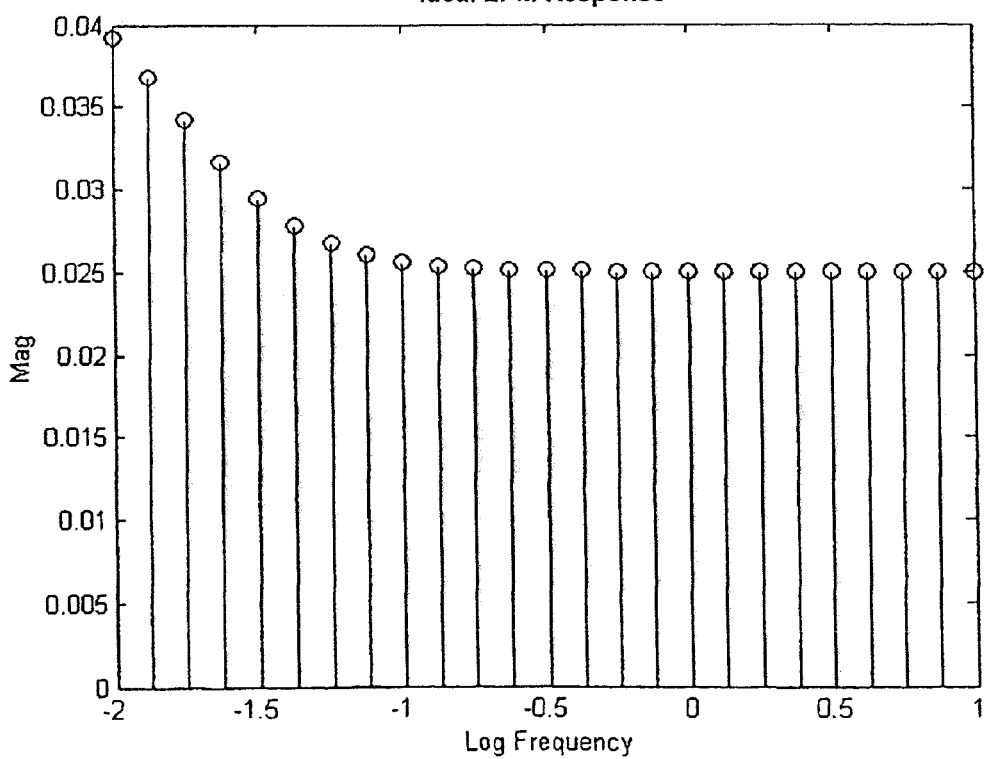
FIG. 16 shows an LPM ideal magnitude response, 25 lines, 10 periods.
Figure 17:
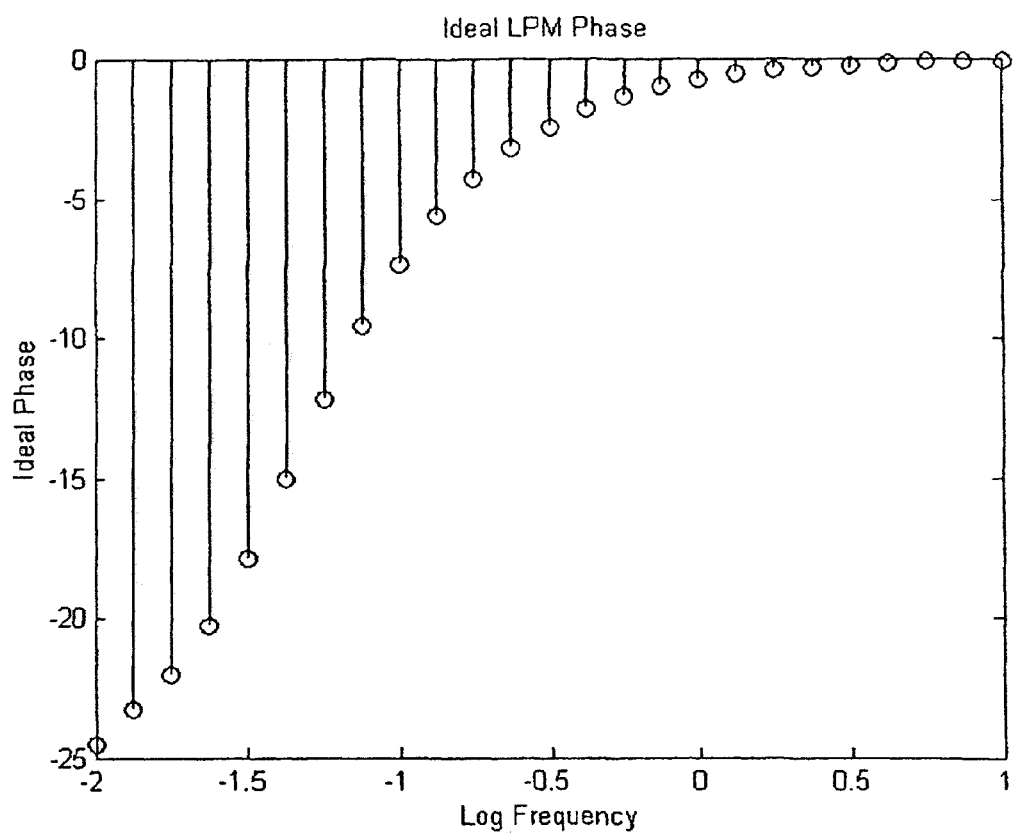
FIG. 17 shows an LPM ideal phase response, 25 lines, 10 periods.
Figure 18:
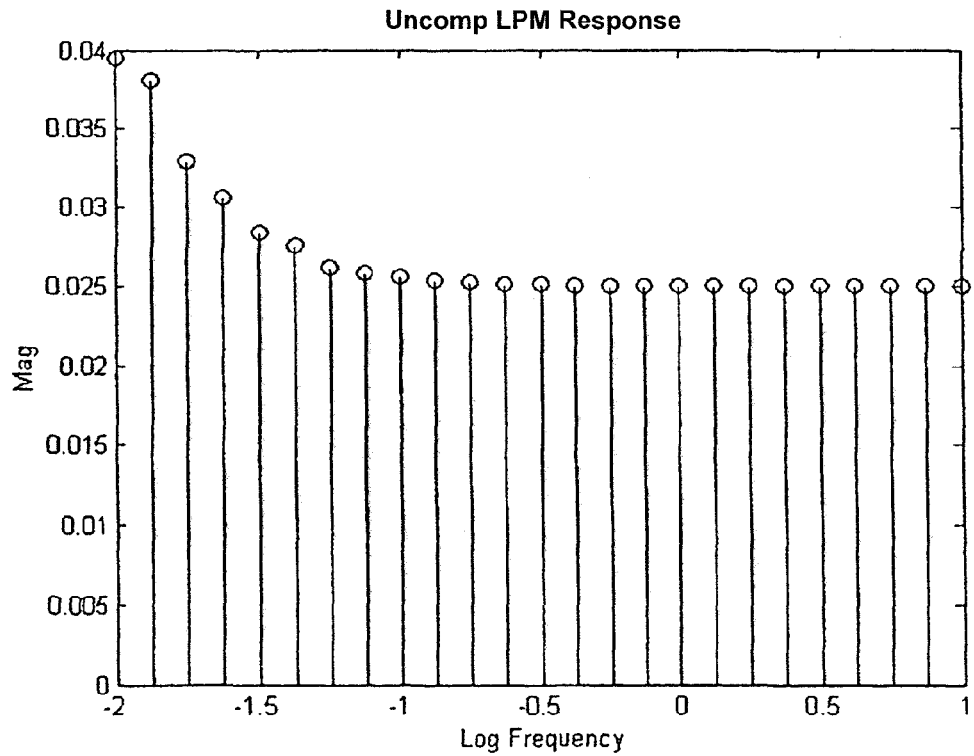
FIG. 18 shows an LPM uncompensated magnitude response, 25 lines, 10 periods.
Figure 19:
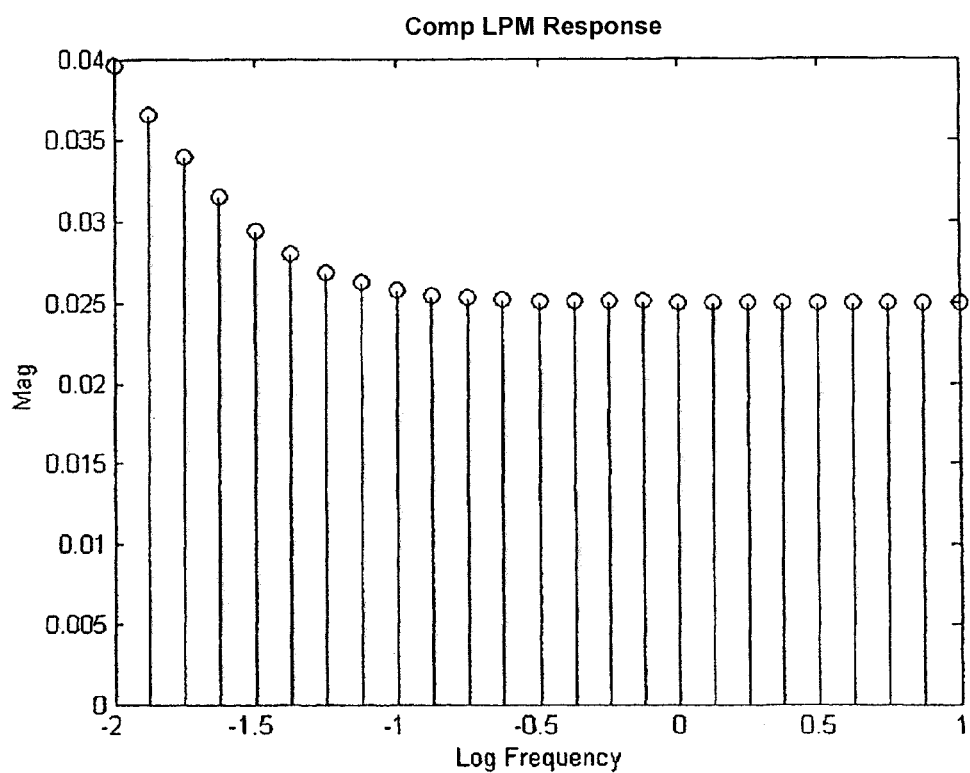
FIG. 19 shows an LPM CSD magnitude response, 25 lines, 10 periods.
Figure 20:
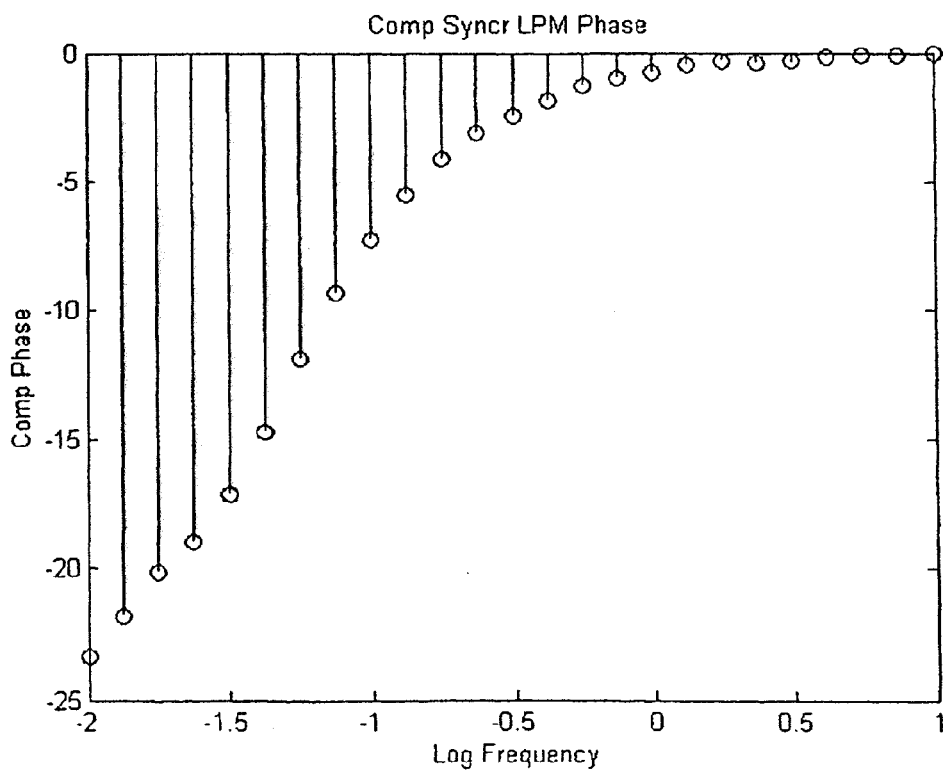
FIG. 20 shows an LPM CSD phase response, 25 lines, 10 periods.

The number of frequency lines was increased to 25 and everything else was left the same. The following 7 figures illustrate the results. FIG. 14 is the time record of the SOS current signal. FIG. 15 is the time record of the LPM voltage response. FIGS. 16 and 17 are the LPM ideal impedance magnitude and phase. FIGS. 18 and 19 are the uncompensated and the compensated magnitude response. FIG. 20 is the compensated phase response.

Additional cases run showed that as the length of the acquired time record in the number of periods of the lowest frequency gets cut back, the number of frequency lines that can be resolved without a big increase in error must be cut back. For example, 5 periods with 25 lines gave terrible results, but 5 periods with 13 lines was fine. These positive results are only analytical. Nevertheless, they offer promise of positive expected performance when applied to a physical system. All the MATLAB® matrix calculation computer codes for this analysis are given by Morrison, 2005, Algorithms as MATLAB® Code for Real time Estimation of Battery Impedance.

Example 4

Neural Network Enhanced Synchronous Detection

In order to improve the accuracy of the CSD, studies were conducted upon neural network enhancement of the detection of the individual frequency components of the response of a linear system to an SOS input signal. The concept is very similar to the CSD, with some slight changes and a neural network output layer. For a second order low-pass filter, ordinary synchronous detection performed on the filter response showed a mean squared error (MSE) of $2.6 \times 10^{-3}$. The compensated synchronous detection technique displayed an MSE of 1.6×10$^{-3}$. The neural network enhanced synchronous detection showed an MSE of 0.2×10$^{-3}$. Results for the lumped parameter model of a lithium ion battery were similar.

The theory of neural network enhanced synchronous detection is based on a classical synchronous detection and an inherent error associated with time records of finite length.

Given an input signal comprised of a sum of N sinusoids:

$$\hat{x}(t) = \sum_{n=1}^{N} x(\omega_n t)$$

the output of the system would be:

$$\hat{y}(t) = \sum_{n=1}^{N} y(\omega_n t)$$

Being that the input and output are sinusoids, they are assumed to have started at t=−∞ and continues to t=∞. In reality, however, this is not the case. First, the time record of the signal is finite in length; second, it is sampled. Given a sampling frequency of at least the Nyquist frequency (twice the highest frequency in the signal), the signal can be reconstructed without error. This does not, however, rectify the finite time length of the signal. Because of this, errors enter into the synchronously detected frequency components.

Synchronous detection involves multiplying the acquired signal by sines and cosines of the desired frequencies and summing the results, as shown below:

$$\alpha_{\omega_n} = \lim_{i \to \infty} \frac{1}{2i} \sum_{j=-i}^{i} y[j] \sin[\omega_n j \Delta t]$$

$$\beta_{\omega_n} = \lim_{i \to \infty} \frac{1}{2i} \sum_{j=-i}^{i} y[j] \cos[\omega_n j \Delta t]$$

The magnitude of a given frequency is obtained as follows:

$$M_{\omega_n} = 2\sqrt{\alpha_{\omega_n}^2 + \beta_{\omega_n}^2}$$

and the phase may also be obtained as follows:

$$P_{\omega_n} = \tan^{-1}\left(\frac{\alpha_{\omega_n}}{\beta_{\omega_n}}\right)$$

where:
y[j]=the sampled signal
α=the sine component of the response for the frequency $\omega_n$
β=the cosine component of the response for the frequency $\omega_n$
Δt=the sample time step Notice that the summations are infinite in length. In application, the summation would be from 0 to the length of the recorded signal. If the time record was infinite, then any errors would cancel out. Since our time record is not infinite, errors remain in the calculated response.

It is important to note that an estimate of the original signal can be reconstructed by summing the sine and cosine signals of the different frequencies, where each sine signal is multiplied by its sine response component and each cosine signal is multiplied by its cosine response component. The resulting estimate would be exact if the time record was infinite, but since it is of finite length, the reconstructed signal is not exactly correct. This may be viewed as containing noise.

$$\tilde{y}[i] = \sum_{n=1}^{N} \alpha_{\omega_n} \sin(\omega_n i \Delta t) + \beta_{\omega_n} \cos(\omega_n i \Delta t) + \eta[i]$$

where:
η[i]=the noise due to error
Δt=the sample time step
i=the i$^{th}$ position in the acquired time record
N=the number of frequency lines In the compensated synchronous detection approach, this difference between the actual signal and the reconstructed signal is exploited to filter out all but one of the frequencies and to increase the accuracy of the measurement (see above). In Neural Network Enhanced Synchronous Detection (NNESD), the approach is slightly different. The premise is that the residual left from subtracting the reconstructed signal from the actual signal still contains some useful information.

$$r[i] = y[i] - \tilde{y}[i]$$

For each frequency of interest, the sine and cosine components are detected on the original signal. These are then used to reconstruct the signal and then stored. The reconstructed signal is then subtracted from the original signal to obtain the residual signal. Synchronous detection is then performed upon this residual signal; once again the sine and cosine components are used to reconstruct the residual signal and are also stored. This second residual signal is then subtracted from the first residual signal. This loop continues until a sufficient number (M) of sine and cosine responses are obtained for each frequency. Now, the assumption that is made is that there is some functional relationship between these M responses and the true responses.

$$\alpha_{\omega_n truth} = f(\alpha_{\omega_n 1}, \beta_{\omega_n 1}, \alpha_{\omega_n 2}, \beta_{\omega_n 2}, \ldots, \alpha_{\omega_n M}, \beta_{\omega_n M})$$

$$\beta_{\omega_n truth} = f(\alpha_{\omega_n 1}, \beta_{\omega_n 1}, \alpha_{\omega_n 2}, \beta_{\omega_n 2}, \ldots, \alpha_{\omega_n M}, \beta_{\omega_n M})$$

This functional relationship most likely varies from system to system and also is based upon system operating conditions. To deduce what this relationship is for any system would be time consuming. Instead, a generalized regression neural network is implemented to predict the true response.

A Generalized Regression Neural Network (GRNN) is a form of a radial basis neural network suitable for problems involving regression, function estimation, or prediction of a continuous value, Wasserman, 1993, Alpaydin, 2004. This is in contrast to a very similar network, the Probabilistic Neural Network, which is used for classification applications. Unlike multi-layer perceptrons, which require training, a GRNN is constructed from a training set of example inputs and the corresponding outputs. The spread of the radial basis function is used to compute the bias. The spread, in effect, controls the spread of the radial basis function. The example inputs are in the form of an m×n matrix where each of the m rows represents an observation and each of the n columns represents a feature, or parameter. The corresponding example output is an m×1 vector. The input is said to be n-dimensional. The network is divided into 2 layers. The first, or input layer, consists of the example inputs. The output layer consists of the example outputs. The network generates its output in the following manner. The geometric distance is calculated between the newly presented input and each of the example inputs in the input layer:

$$d_m = \sqrt{\sum_{n=1}^{N}(x_n - IW_n)^2}$$

This produces a vector of length m. Each element of the vector is then multiplied by the bias, which is 0.8326/Spread. The vector then goes through the radial basis function.

$$y = e^{-x^2}$$

The radial basis function produces an output that gets closer to 1 as the input gets closer to 0. The resulting vector is a ranking of how close each of the example cases are to the new input. The normalized dot product is then calculated between the vector and the example output vector. This is the network output.

$$y = \frac{1}{M}\sum_{m=1}^{M} x_m LW_m$$

The NNESD is based upon the GRNN approach. Analytical testing will provide a preliminary validation of the concept.

Figure 21:
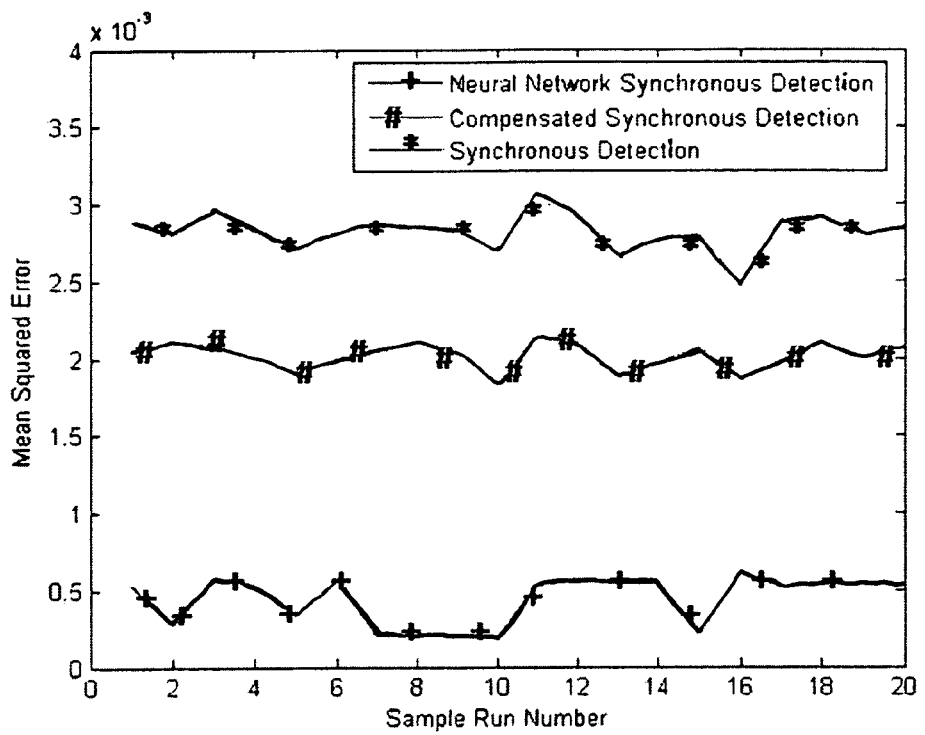
FIG. 21 shows a Mean Squared Error (MSE) comparison for a low-pass filter frequency response.

The NNESD concept was analytically tested on a $2^{nd}$ order Butterworth filter using the MATLAB® matrix calculating computer software BUTTER function and the INL LPM FreedomCAR Battery Test Manual, 2003, Fenton et al., 2005, for the lithium ion battery. An SOS input signal was used for both cases. For the filter, the component frequencies were varied for each run in order to build up a training set with 10 component lines to be detected. The filter was run 100 times and the output and target response was calculated. The data was randomized and half of the data was used to construct the GRNN and the other half was used to verify the network. The mean squared error (MSE) of the predicted value was calculated and the process was repeated 20 times, shuffling the data each time. The results are shown in FIG. 21. The MSE of both the standard synchronous detection and the CSD are also shown for comparison. The MATLAB® matrix calculation computer software code used for this analysis is disclosed by Morrison, 2005, Intelligent Self-Evolving Prognostic Fusion.

Figure 22:
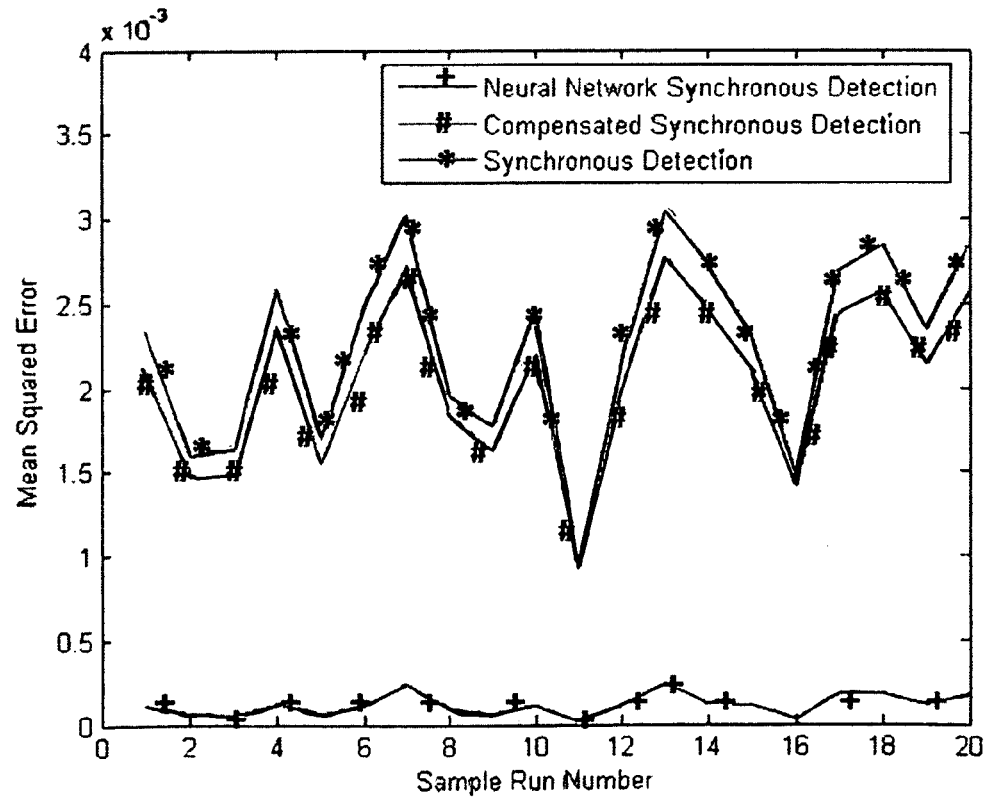
FIG. 22 shows an MSE comparison for detection of LPM impedance.

The technique was then tested on the LPM FreedomCAR Battery Test Manual, 2003, Fenton et al., 2005. The input parameters to the model were nominally set as per Table 2 and randomly varied by up to 5% each run for 100 runs to generate the dataset. The number of lines, frequency spread and time step were held as per Table 2. The same training and testing scheme that was outlined above was used. The results are shown in FIG. 22. The MATLAB® matrix calculation computer software code used for this analysis is given in Morrison, 2005, Intelligent Self-Evolving Prognostic Fusion.

This limited analytical validation has shown that the NNESD concept will significantly reduce the error in the estimate of the frequency components of a given system response signal. This concept allows a parallel implementation for swept frequency measurements to be made by utilizing a composite signal of a single time record that greatly reduces testing time without a significant loss of accuracy.

Conclusions

The physical validation of the CSD or NNESD concept will rely heavily on work performed by W. Albrecht in his thesis research: "Battery Complex Impedance Identification with Random Signal Techniques," Albrecht, 2005. In this approach, a National Instruments data acquisition and processing system was used along with a custom analog conditioning system. The CSD or NNESD algorithm could be installed directly on the custom analog conditioning system. The system software will be CSD or NNESD rather than Noise Identification of Battery Impedance (NIBI). The NIBI approach would acquire about 100 time records of the battery response to noise current. Clearly, a time record would have to be of a length of multiple periods of the lowest frequency of interest. The CSD or NNESD approach will acquire one time record of a length of multiple periods (exact number is still to be determined) of the lowest frequency of interest. The excitation signal would be generated analytically with software, as in the NIBI system. The analytical signal would be preconditioned with a digital low-pass filter as in the NIBI system. The CSD or NNESD system may require an analog filter prior to the current driver and after the D/A. This analog filter at the current driver could serve as the prime anti-aliasing filter. This system will use the same bias compensation approach to remove most of the DC battery voltage from the acquired signal. Improved noise rejection and increased sensitivity could be achieved if the voltage sensing were upgraded to full differential via a 4-wire system rather than the 2-wire single-ended system of the NIBI. An increase in sensitivity will enable a reduction in the level of the excitation signal required. It is anticipated that the sampled voltage will be processed directly with the CSD or NNESD algorithm. It is also anticipated that a system calibration would be done exactly as the NIBI system by measuring the impedance of the test leads to determine any system measurement offset and phase shift.

Currently, calibrating the CSD system for magnitude response is done using current shunts in place of a test battery. Multiple shunts encompassing range of response are measured and the resulting data are used to generate a linear regression calibration curve. This technique is also essentially a one-point phase calibration with the shunt, by definition, having zero degrees of phase shift over the frequency range of interest. Since the entire measurement system is a series process, phase shift in the excitation signal, the test object, the detection amplifier or the processing algorithm all look like phase shift. Thus, during shunt calibration, additional multi-point phase calibrations can be obtained by introducing a calibrated phase shift into each frequency of the SOS excitation signal and the response processed in the CSD algorithm by using the non-phase shifted SOS signal. A multi-point linear regression magnitude calibration, as well as a multi-point linear regression phase calibration, is obtained.

The principal attribute of the CSD method is the ability to obtain a limited resolution frequency spectrum of a system function in real time. Resolution of just a dozen frequency lines is traded off to obtain the very desirable feature of real-time response. The CSD system is able to reduce cross-talk between adjacent frequency lines over and above what would occur with only synchronous detection. Nevertheless, the number of frequency lines in the single time record must be limited. In a particularly preferred embodiment, a user can choose to increase resolution at the expense of increased response time with either operation. The limited number of frequency lines in the SOS is adhered to in a single time record. However, for either operation additional time records are run with each frequency shifted by a shift factor and the additional spectra acquired are interleaved to obtain an overall higher resolution spectrum. Thus, a user can make a custom trade-off of spectrum resolution against response time for an application.

Figure 30:
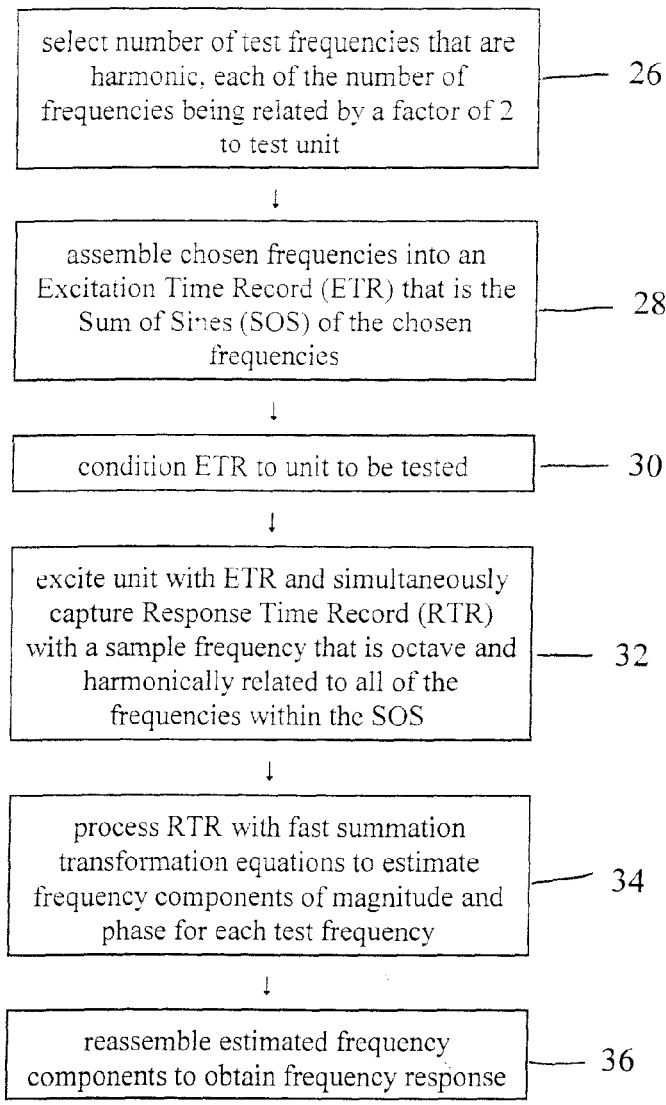
FIG. 30 is a flow chart showing another preferred method of the subject invention.

The CSD system processes the system response of the SOS excitation via repeated synchronous detection acting on a residual signal whereby cross-talk contributors have been subtracted out. An alternative embodiment of the method of detecting system function of the subject invention, as shown in the flow chart of FIG. 30, uses a fast summation algorithm to process the system response of the SOS excitation at step 32. In the Fast Summation Transformation (FST) embodiment, all the frequencies of the SOS are harmonics by powers of two at step 26. Additionally, the sample period is also a power of two with all the SOS frequencies at step 32. Instead of multiplying the acquired time record by the sine and the cosine of each frequency, the SOS is simply rectified relative to the square wave and the 90-degree shifted square wave of the desired frequency. When the samples of that processed time record are summed, all the octave-related harmonics, other than the frequency of interest will always sum to zero. The resulting "In Phase" and "Quadrature" sums can be easily processed to yield the magnitude and phase shift of the desired frequency component at step 34.

The FST algorithm can be used to estimate a battery impedance spectrum at step 36. The excitation Sum of Sines (SOS) signal formation at steps 26, 28, 30, the methodology to apply it as a current signal to a test battery and the capture of the battery voltage response time record at step 32 is almost identical to the CSD approach. However, the difference is, if the SOS excitation time record contains only sine waves whose frequencies are all related by octave and harmonics, and the sample time is also octave and harmonically related, then if that captured time record is "rectified" relative to one of the SOS frequencies at step 34, when that transformed time record is summed, it will contain only battery response information relative to that frequency. To identify a specific battery frequency response in the SOS signal, the response time record is square wave rectified with a phase relationship relative to a sine wave of that frequency at step 36. Then, all the points in the time record of that transformed signal are simply totaled up and normalized to the number of periods of that frequency present in the SOS signal. This result becomes a numerical parameter $m_1$. The process is performed again except the rectification square wave phase is relative to the cos of the frequency of interest. This other result becomes another numerical parameter $m_2$. For all the other frequencies, except the one of interest, all the samples of those sine waves of the transformed record will always total to zero. The amplitude and phase response of that frequency are obtained as per the following relationships. Equation 1 represents the sampled signal component at a specific frequency that is to be detected. The amplitude, $V_P$ and phase, $\phi$ are the desired information.

$$V_P \sin\left(\frac{2\pi}{N}n + \phi\right) = V_P \sin\left(\frac{2\pi}{N}n\right)\cos\phi + V_P \cos\left(\frac{2\pi}{N}n\right)\sin\phi \tag{1}$$

Where:
  $V_P$ is the amplitude response of the frequency of interest
  N is the number of samples over a period of the frequency of interest
  $\phi$ is the phase response of the frequency of interest
  n is the discrete time index
  In Equation 1, N must be constrained as $\log_2(N)$ must be an integer greater than 1. Additionally, the frequency of interest is given as:

$$f = \frac{1}{N \Delta t} \tag{2}$$

Where: $\Delta t$ is the sample period.

In Equation 3, the signal has been rectified relative to a sine wave of that frequency and all the sample values are totaled up.

$$m_1 = V_P \sum_{n=0}^{\frac{N}{2}-1} \sin\left(\frac{2\pi}{N}n + \phi\right) - V_P \sum_{n=\frac{N}{2}}^{N-1} \sin\left(\frac{2\pi}{N}n + \phi\right) \tag{3}$$

In Equation 4, the signal has been rectified relative to the cosine wave of that frequency and again the samples are totaled up. Observe that rectification simply involves changing the sign of the sample values relative to the sine wave or cosine wave timing.

$$m_2 = \tag{4}$$
$$V_P \sum_{n=0}^{\frac{N}{4}-1} \sin\left(\frac{2\pi}{N}n + \phi\right) - V_P \sum_{n=\frac{N}{4}}^{3\frac{N}{4}-1} \sin\left(\frac{2\pi}{N}n + \phi\right) + V_P \sum_{n=3\frac{N}{4}}^{N-1} \sin\left(\frac{2\pi}{N}n + \phi\right)$$

$$m_1 = V_P \sum_{n=0}^{\frac{N}{2}-1} \left(\sin\left(\frac{2\pi}{N}n\right)\cos\phi + \cos\left(\frac{2\pi}{N}n\right)\sin\phi\right) - \tag{5}$$
$$V_P \sum_{n=\frac{N}{2}}^{N-1} \left(\sin\left(\frac{2\pi}{N}n\right)\cos\phi + \cos\left(\frac{2\pi}{N}n\right)\sin\phi\right)$$

$$m_1 = V_P \cos\phi \underbrace{\left[\sum_{n=0}^{\frac{N}{2}-1}\left(\sin\left(\frac{2\pi}{N}n\right)\right) - \sum_{n=\frac{N}{2}}^{N-1}\left(\sin\left(\frac{2\pi}{N}n\right)\right)\right]}_{K_1} +$$

$$V_P \sin\phi \underbrace{\left[\sum_{n=0}^{\frac{N}{2}-1}\left(\cos\left(\frac{2\pi}{N}n\right)\right) - \sum_{n=\frac{N}{2}}^{N-1}\left(\cos\left(\frac{2\pi}{N}n\right)\right)\right]}_{K_2}$$

$$m_2 = V_P \sum_{n=0}^{\frac{N}{4}-1}\left(\sin\left(\frac{2\pi}{N}n\right)\cos\phi + \cos\left(\frac{2\pi}{N}n\right)\sin\phi\right) - \tag{6}$$
$$V_P \sum_{n=\frac{N}{4}}^{3\frac{N}{4}-1}\left(\sin\left(\frac{2\pi}{N}n\right)\cos\phi + \cos\left(\frac{2\pi}{N}n\right)\sin\phi\right) +$$
$$V_P \sum_{n=3\frac{N}{4}}^{N-1}\left(\sin\left(\frac{2\pi}{N}n\right)\cos\phi + \cos\left(\frac{2\pi}{N}n\right)\sin\phi\right)$$

$$m_2 = V_P \cos\phi \underbrace{\left[\sum_{n=0}^{\frac{N}{4}-1}\left(\sin\left(\frac{2\pi}{N}n\right)\right) - \sum_{n=\frac{N}{4}}^{3\frac{N}{4}-1}\left(\sin\left(\frac{2\pi}{N}n\right)\right) + \sum_{n=3\frac{N}{4}}^{N-1}\left(\sin\left(\frac{2\pi}{N}n\right)\right)\right]}_{K_3} +$$

$$V_P \sin\phi \underbrace{\left[\sum_{n=0}^{\frac{N}{4}-1}\left(\cos\left(\frac{2\pi}{N}n\right)\right) - \sum_{n=\frac{N}{4}}^{3\frac{N}{4}-1}\left(\cos\left(\frac{2\pi}{N}n\right)\right) + \sum_{n=3\frac{N}{4}}^{N-1}\left(\cos\left(\frac{2\pi}{N}n\right)\right)\right]}_{K_4}$$

Note that the parameters $K_1$, $K_2$, $K_3$, $K_4$ are known for each frequency and $m_1$, $m_2$ are the numerical result of the rectifying algorithm for each frequency. Then, the magnitude and phase at each frequency can be obtained as follows:

$$m_1 = V_P\cos\phi K_1 + V_P\sin\phi K_2 \Rightarrow \begin{bmatrix} m_1 \\ m_2 \end{bmatrix} = \begin{bmatrix} K_1, & K_2 \\ K_3, & K_4 \end{bmatrix} \begin{bmatrix} V_P\cos\phi \\ V_P\sin\phi \end{bmatrix} \quad (7)$$
$$m_2 = V_P\cos\phi K_3 + V_P\sin\phi K_4$$

$$\begin{bmatrix} V_P\cos\phi \\ V_P\sin\phi \end{bmatrix} = \begin{bmatrix} \dfrac{K_4}{K_1 K_4 - K_2 K_3}, & \dfrac{K_2}{K_2 K_3 - K_1 K_4} \\ \dfrac{K_3}{K_2 K_3 - K_1 K_4}, & \dfrac{K_1}{K_1 K_4 - K_2 K_3} \end{bmatrix} \begin{bmatrix} m_1 \\ m_2 \end{bmatrix}$$

$$\text{Let: } \begin{aligned} V_P\sin\phi &= C_1 \\ V_P\cos\phi &= C_2 \end{aligned}, \text{ then: } \begin{aligned} V_P\sqrt{C_1^2 + C_2^2} \\ \phi = \tan^{-1}\left(\dfrac{C_1}{C_2}\right) \end{aligned} \quad (8)$$

For all other signal frequencies present in the rectification process, their values must total to zero whenever the rectification is not their specific frequency. The FST system must preserve the property of orthogonality between the different frequencies. Additionally, any noise present, even after rectification, will be mitigated by the summation process. Thus, for this technique, mathematically, cross-talk from adjacent frequencies will be zero and the SOS time record length can be as short as one period of the lowest frequency. However, the FST method only works if the octave harmonic relationship holds for all frequencies in the SOS including the sample frequency. This ensures that over a period of any frequency present in the SOS there will always be an even number of samples. The implementation of the rectification functions with discrete signals in a manner that preserves orthogonality between different frequencies will be discussed in the next section.

The algorithm shown above can be realized as computer code. A rectification function is simply a unity amplitude square wave. FST uses two forms at each frequency, one with the phase relationship of a sine wave and the other with the phase relationship of a cos wave. In a continuous time domain, a perfect unit rectification function makes an instant transition from −1 to +1. In a discrete rectification function, there are two means for transitioning from +1 to −1 and the reverse: pass through zero at a discrete time step or pass through zero midway between discrete time steps. In the discrete time domain, the implementation of a rectification function must preserve FST orthogonality between different frequencies (i.e., no cross-talk).

The sine waveform of the non-zero rectification function is given as:

$$Rs(n) = \begin{bmatrix} 1, & 0 \le n < \dfrac{N}{2} \\ -1, & \dfrac{N}{2} \le n < N \end{bmatrix} \quad (9)$$

Where: N is the number of samples over the period.
The cos waveform of the rectification function is given as:

$$Rc(n) = \begin{bmatrix} 1, & 0 \le n < \dfrac{N}{4} \\ -1, & \dfrac{N}{4} \le n < \dfrac{3N}{4} \\ 1, & \dfrac{3N}{4} \le n < N \end{bmatrix} \quad (10)$$

Where: N is the number of samples over the period.

The sine waveform of the rectification function with zeros is given as:

$$Rs(n) = \begin{bmatrix} 0, & n = 0 \\ 1, & 0 < n < \dfrac{N}{2} \\ 0, & n = \dfrac{n}{2} \\ -1, & \dfrac{N}{2} < n < N \end{bmatrix} \quad (11)$$

Where: N is the number of samples over the period.
The cos waveform of the rectification function with zeros is given as:

$$Rc(n) = \begin{bmatrix} 1, & 0 \le n < \dfrac{N}{4} \\ 0, & n = \dfrac{N}{4} \\ -1, & \dfrac{N}{4} < n < \dfrac{3N}{4} \\ 0, & n = \dfrac{3N}{4} \\ 1, & \dfrac{3N}{4} < n < N \end{bmatrix} \quad (12)$$

Where: N is the number of samples over the period.

There are two means to implement the non-zero rectification function (Equations 9 and 10), but only one means to implement the rectification with zeros (Equations 11 and 12). All means give nearly identical results. For the non-zero rectification function, the more complicated means that will work is to take the average between consecutive sample pairs to obtain the samples to be summed. Specifically, if one averages between points of the sinusoid going around a circle, with the last point of the period averaged with the first point. The sign of the non-zero rectification function is applied to these averaged samples. As an example, consider an eight point unity amplitude discrete sine and cos signal.

One period of an 8-point discrete sine wave:

$$\sin\left(\dfrac{2\pi}{8}n\right) = [0, 0.707, 1.0, 0.707, 0, -0.707, -1.0, -0.707] \quad (13)$$

One period of an 8-point discrete cos wave:

$$\cos\left(\dfrac{2\pi}{8}n\right) = [1.0, 0.707, 0, -0.707, -1.0, -0.707, 0, 0.707] \quad (14)$$

Thus, with the sine, the 2-point averages rectified by Equation 9, the non-zero sine rectification:

:FSTss=[(0+0.707)/2+(0.707+1)/2+(1+0.707)/2+
(0.707+0)/2−(0−0.707)/2−(−0.707−1)/2−(−1−
0.707)/2−(−0.707+0)/2]=2(0.707)+2(1.707)

Now, the cos rectified by Equation 9, the sine:

FSTcs=[(1+0.707)/2+(0.707+0)/2+(0−0.707)/2+(−
0.707−1)/2−(−1−0.707)/2−(−0.707+0)/2−(0+
0.707)/2−(0.707+1)/2]=0

Now, with the sine 2-point averages rectified by Equation 10, the non-zero cos rectification:

:FSTsc=[(0+0.707)/2+(0.707+1)/2−(1+0.707)/2−
(0.707+0)/2−(0−0.707)/2−(−0.707−1)/2+(−1−
0.707)/2+(−0.707+0)/2]=0

Finally, the cos rectified by Equation 10, the cos:

FST$cs$=[(1+0.707)/2+(0.707+0)/2−(0−0.707)/2−(−0.707−1)/2−(−1−0.707)/2−(−0.707+0)/2+(0+0.707)/2+(0.707+1)/2]=2(0.707)+2(1.707)

Observe the existence of orthogonality with the sine rectified by the cos, or the cos rectified by the sine. This is an interesting but unnecessary result that is not needed by the FST algorithm.

The second means of rectification for the non-zero rectification function, and the preferred, is the simplest for the FST technique. For rectification, one just changes the signs of the captured time record as per Equations 9 and 10. Consider the same eight sample discrete sine and cos waves rectified by the second means. First, the sine rectified by the sine, Equation 9: rectification:

:FST$ss$=[0+0.707+1+0.707+0−(−0.707)−(−1)−(−0.707)]=4(0.707)+2

Next, the cos rectified by the sine, Equation 9:

FST$cs$=[1+0.707+0−0.707−(−1)−(−0.707)−(0)−(0.707)]=2

Now, the sine rectified by the cos, Equation 10

FST$sc$=[0+0.707−(1)−0.707−(0)−(−0.707)+(−1)+(−0.707)]=−2

Finally, the cos rectified by the cos, Equation 10:

FST$cc$=[1+0.707−(0)−(−0.707)−(−1)−(−0.707)+0+0.707]=4(0.707)+2

For the rectification with zeros, Equations 11 and 12, consider the same eight sample discrete sine and cos waves rectified by a second mean. First, the sine rectified by the sine, Equation 11: rectification:

:FST$ss$=[0+0.707+1+(0.707)+0−(−0.707)−(−1)−(−0.707)]=4(0.707)+2

Next, the cos rectified by the sine, Equation 11:

FST$sc$=[0+0.707+0−(0.707)+0−(−0.707)+0−0.707]=0

Now, the sine rectified by the cos, Equation 12

FST$sc$=[0+0.707+0−0.707−0−(−0.707)−(0)−(0.707)]=0

Finally, the cos rectified by the cos, Equation 12:

FST$cc$=[1+0.707+0−(−0.707)−(−1)−(−0.707)+0+0.707]=4(0.707)+2

Again, observe the existence of orthogonality with the sine rectified by the cos or the cos rectified by the sine. This is an interesting but unnecessary result that is not needed by the FST algorithm.

Example 5

Analytical Testing of Non-Zero Rectification (Preferred Non-Averaging)

The non-zero sine and cos rectification functions in the preferred non-averaging means, Equations 9 and 10, respectively, when implemented into the FST Equations 1 through 8, preserve orthogonality between frequencies. This is shown via a MATLAB® matrix calculation computer software code that builds a discrete time record of an SOS where the frequencies are octave harmonics including the sample frequency. All the sinusoids in the SOS start at time zero, have zero phase shift and unity amplitude. The process starts with all waves being sine waves and being rectified with the sine rectification function, Equation 9, for each frequency and then repeat with rectification by the cos rectification function, Equation 10. Then, the SOS is all cos waves and is rectified with the sine rectification function, Equation 9. Cross-talk is always expected to be zero and, thus, there is orthogonality between frequencies. For this evaluation, the SOS is picked to consist of 10 distinct frequencies, all of which are octave and harmonically related with the highest frequency having 32 samples per period. The time record length is 1 period of the lowest frequency. For Case 1, the SOS is made from discrete sine waves and for Case 2, the SOS is made from discrete cos waves. Orthogonality is proven by deleting an arbitrary frequency from the SOS or SOC and then trying to detect it with the FST Equations 1 through 8. If the result of detection is zero, then there is no cross-talk from any of the other frequencies and orthogonality is established.

Case 1

SOS is unity amplitude sine waves, 10 octave frequencies with 32 samples per period of the highest frequency. The SOS time record length is 1 period of the lowest frequency. Orthogonality is tested between frequencies by deleting from the SOS an arbitrary frequency and then using FST to detect it. Anything that is detected will be cross-talk corruption. The 3rd frequency was deleted. The results for sine and cos rectification FST are:

Out$s$=[0.6366 0.6366 0.0000 0.6366 0.6366 0.6366 0.6366 0.6365 0.6361 0.6346]

Out$c$=[−0.0001 −0.0002 0.0000 −0.0010 −0.0020 −0.0039 −0.0078 −0.0156 −0.0313 −0.0625]

As expected, there is no response at the 3rd frequency. In fact, whichever frequency is deleted, there will be no response at that frequency; thus, orthogonality between frequencies is considered valid relative to an SOS.

Case 2

The parameters are the same as in Case 1, except SOS is cosine waves (SOC). Now, if an arbitrary frequency is deleted from the SOC, detection of the deleted frequency measures cross-talk. If there is orthogonality between frequencies, the result should be zero. The 5th frequency was deleted and the cos and sine results, respectively, are:

Out$c$=[0.6366 0.6366 0.6366 0.6366 0.0000 0.6366 0.6366 0.6365 0.6361 0.6346]

Out$s$=[0.0001 0.0002 0.0005 0.0010 0.0000 0.0039 0.0078 0.0156 0.0313 0.0625]

Again, as expected, there is no response at the 5th frequency. In fact, whichever frequency is deleted, there will be no response at that frequency; thus, orthogonality between frequencies is considered valid relative to a SOC.

Example 6

Non-Zero Rectification FST Applied to a Battery Model

The method of the subject invention using the FST algorithm with non-zero rectification was applied to a battery model. Specifically, by recursive implementation of the INL Lumped Parameter Model (LPM) (FreedomCAR Battery Test Manual, 2003). LPM parameters were the same as those used in Example 3. Several cases were analyzed and results plotted as FST compared to ideal LPM impedance (classical $j\omega$ circuit analysis). The plots were Bode (magnitude and phase) and Nyquist. All these plots are shown in continuous format rather than the discrete format of Example 3. Nevertheless, the individual points as computed are clearly indicated.

Case 1

Figure 24A:
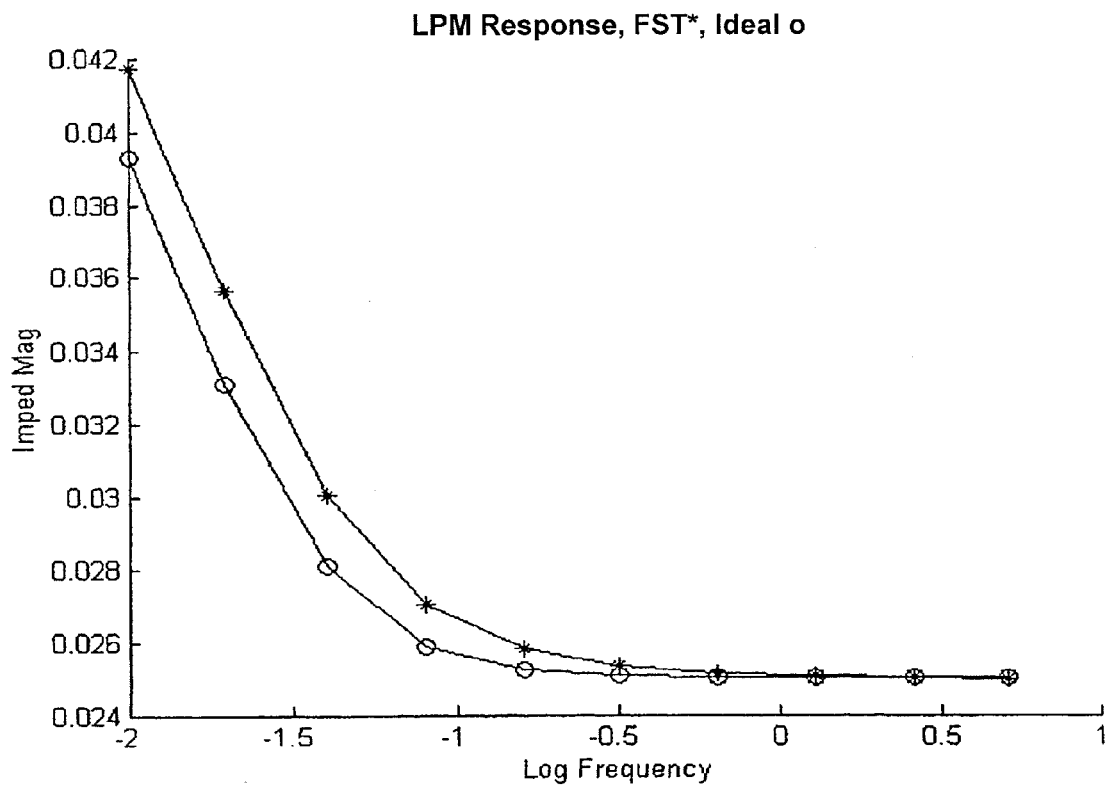
FIG. 24A shows a Fast Summation Transformation (FST) impedance spectrum as magnitude vs. frequency.
Figure 24B:
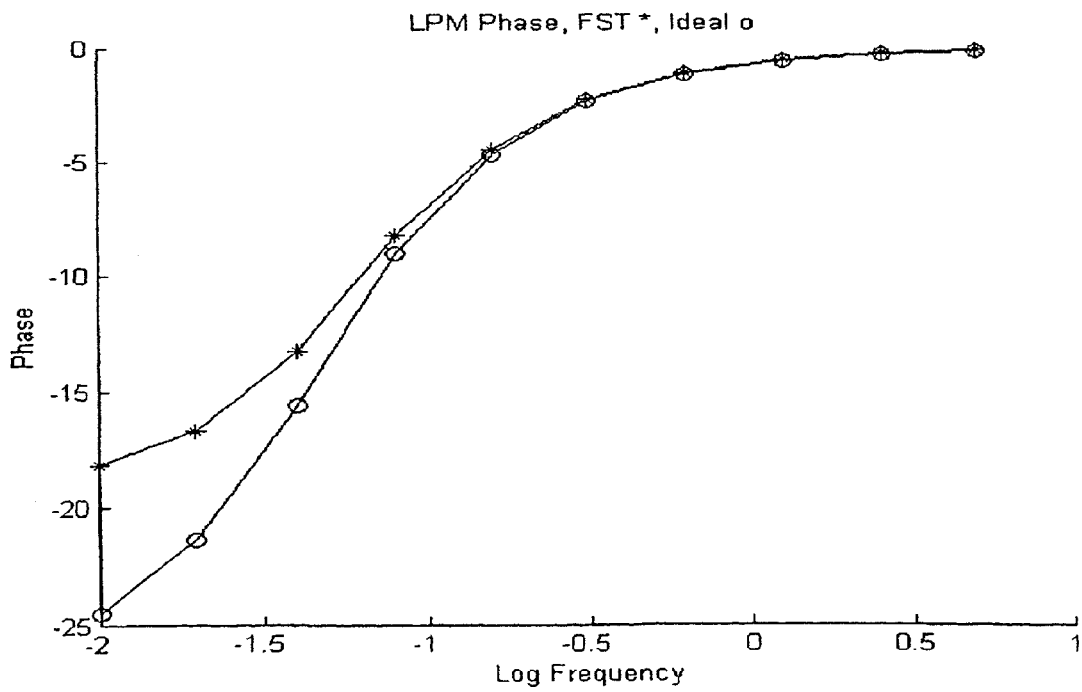
FIG. 24B shows an FST impedance spectrum as phase vs. frequency.
Figure 24C:
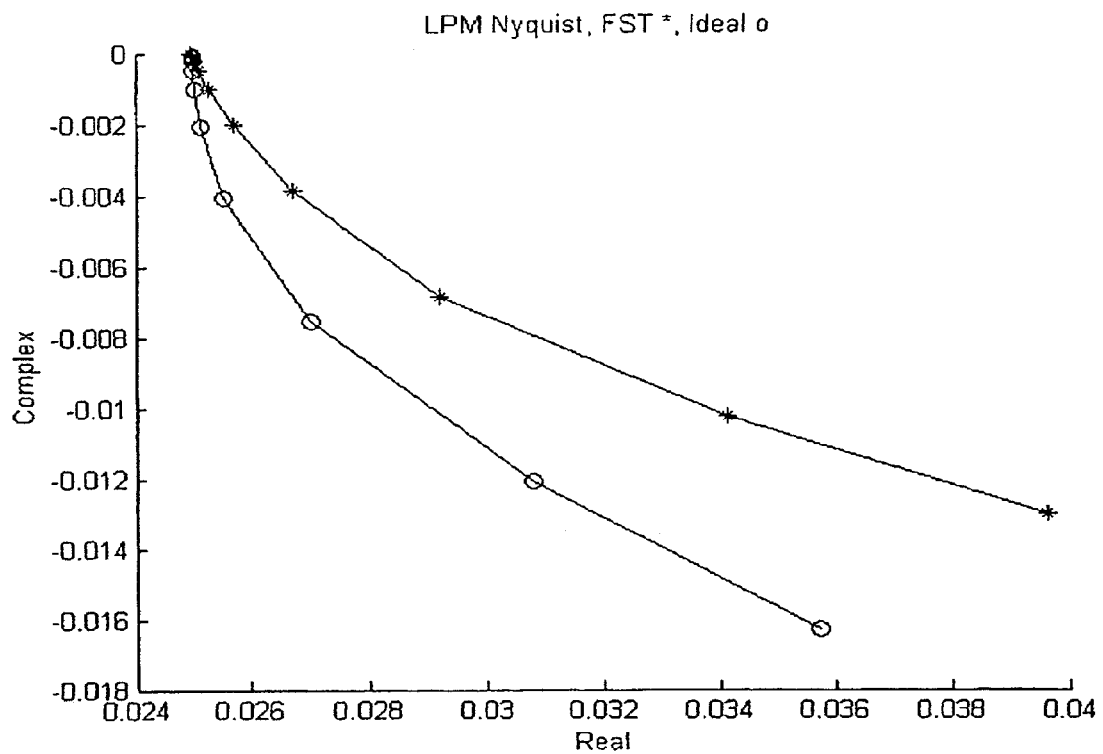
FIG. 24C shows an FST impedance spectrum as a Nyquist plot of imaginary component vs. real component.

In the first case analyzed, the SOS started at 0.01 Hz, had 10 frequencies, the time record length was 1 period of the 0.01 Hz, and the highest frequency was set to 4 samples as this is considered a worst-case lower limit. FIGS. 24A-24C show the impedance spectrum results, respectively, as magnitude vs. frequency, phase vs. frequency and the Nyquist plot of imaginary component vs. real component.

Case 2

Figure 25A:
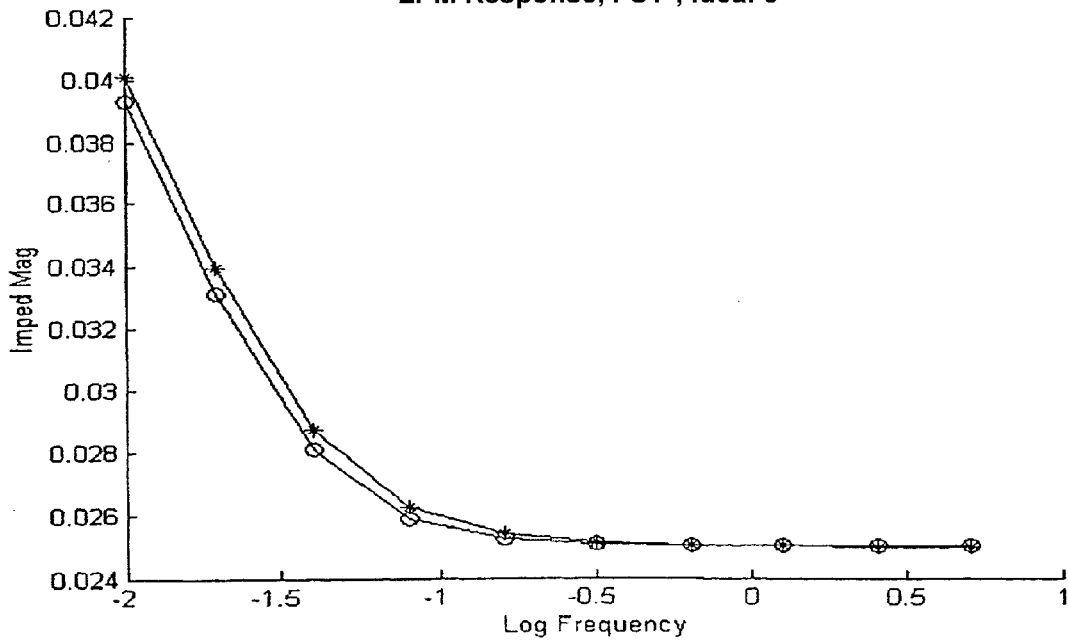
FIG. 25A shows an FST impedance spectrum as magnitude vs. frequency.
Figure 25B:
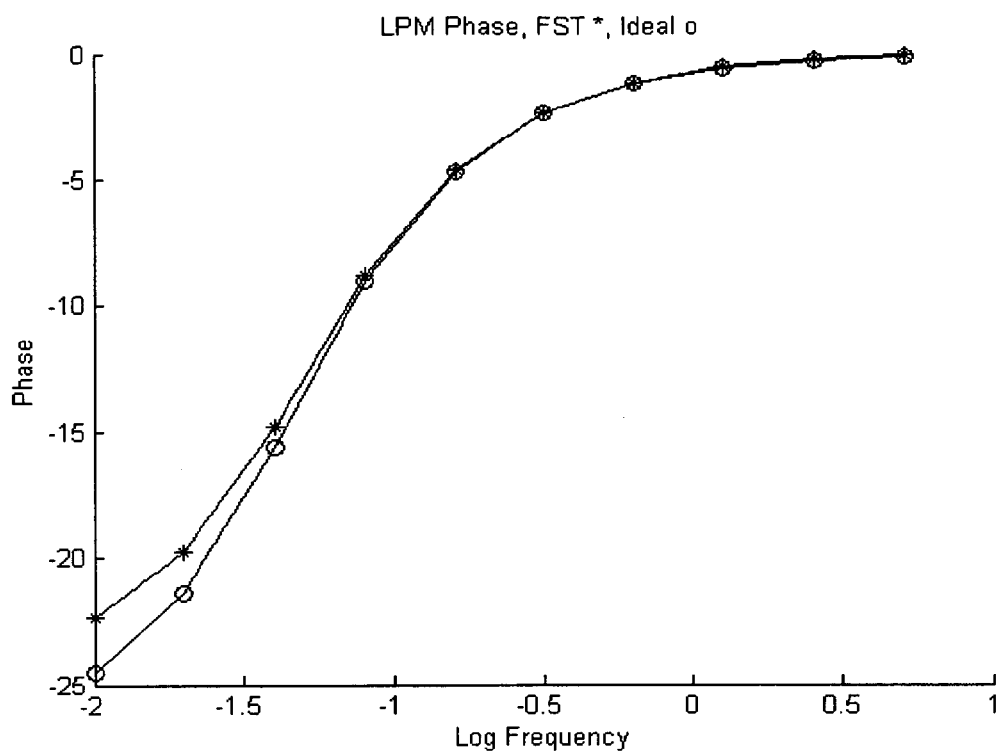
FIG. 25B shows an FST impedance spectrum as phase vs. frequency.
Figure 25C:
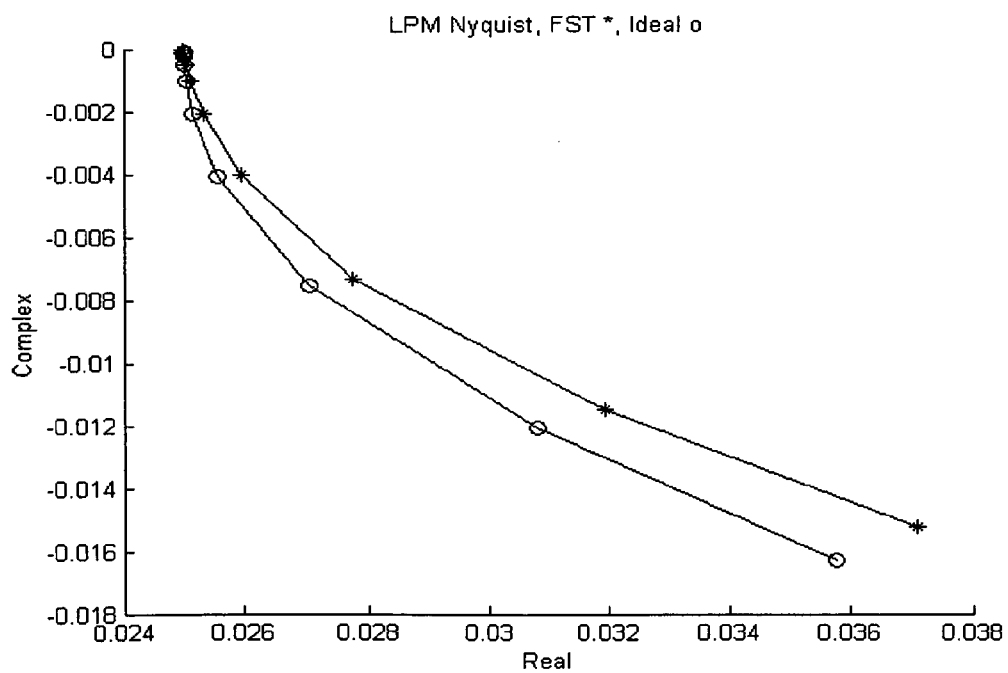
FIG. 25C shows an FST impedance spectrum as a Nyquist plot of imaginary component vs. real component.

It is suspected that the observed error between FST and the ideal response is due to the transient response of the LPM. Thus, this case is the same as Case 1 except the time record was increased to 3 periods of the 0.01 Hz frequency. FIGS. 25A-25C show the results in the same format as Case 1.

Case 3

Figure 26A:
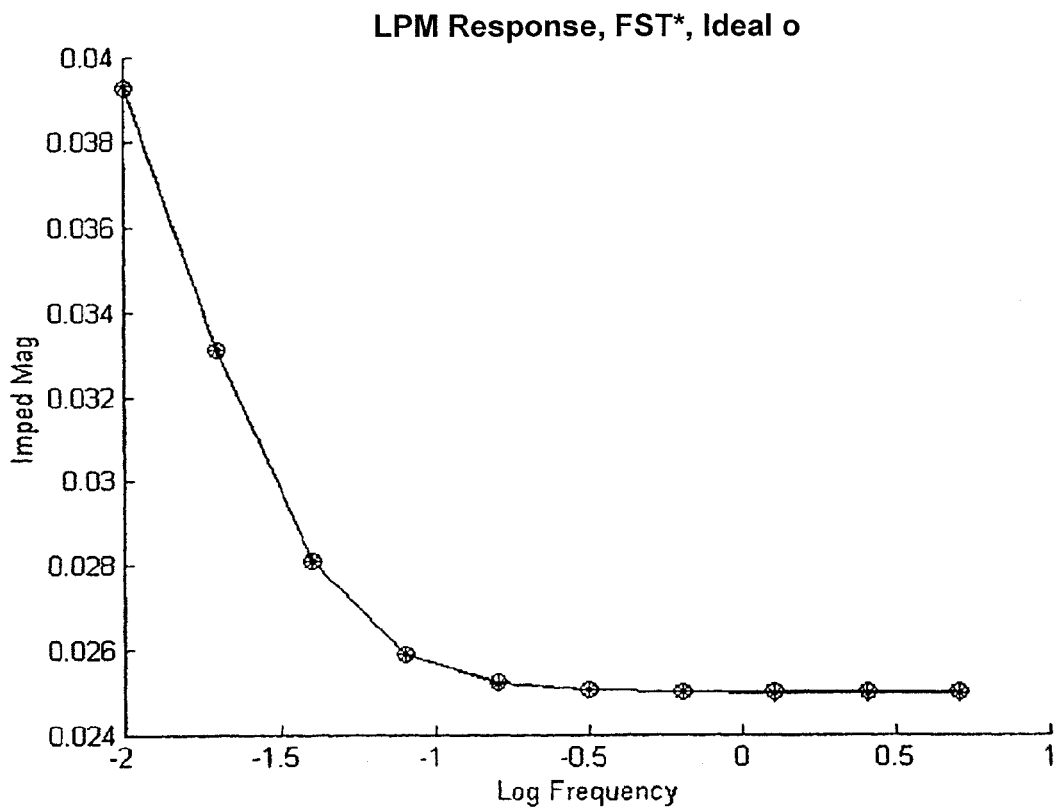
FIG. 26A shows an FST impedance spectrum as magnitude vs. frequency.
Figure 26B:
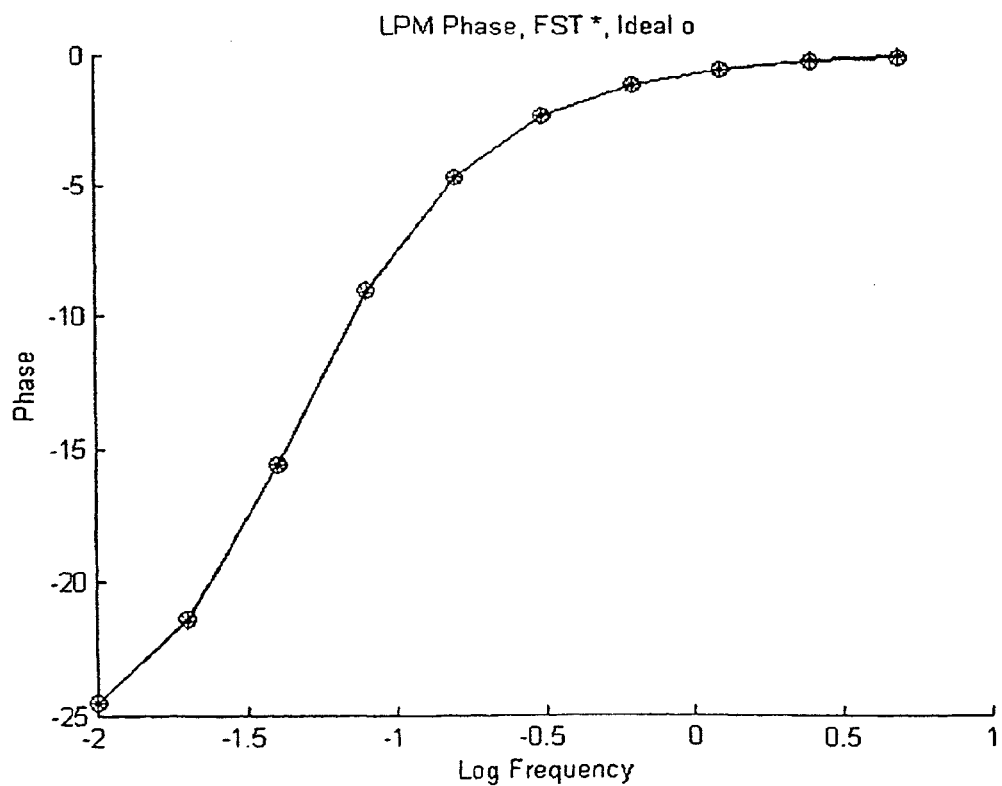
FIG. 26B shows an FST impedance spectrum as phase vs. frequency.
Figure 26C:
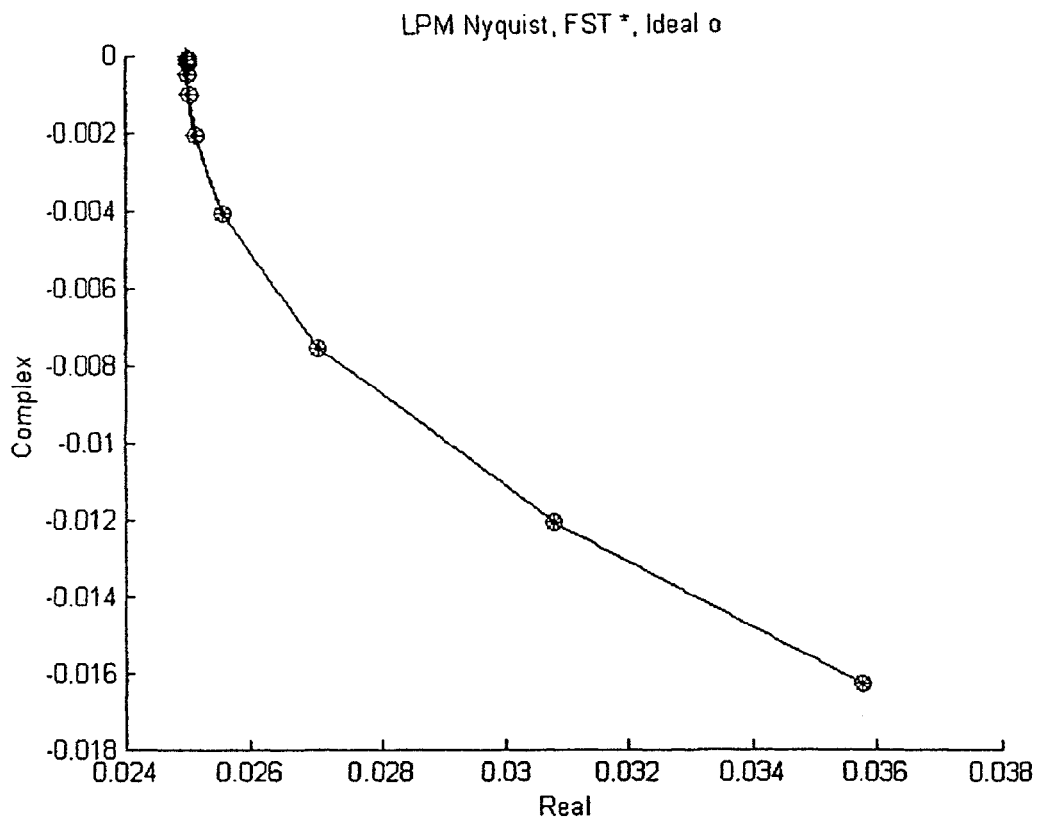
FIG. 26C shows an FST impedance spectrum as a Nyquist plot of imaginary component vs. real component.

In Case 2, it was observed that with the time record of Case 1 expanded to 3 periods of the lowest frequency, the error was greatly reduced but still present. Case 3 is the same as Case 1 except the time record is set at 2 periods of the lowest frequency and then the first period is ignored and only the second period is processed. The objective was to delete from the time record the LPM-corrupting transient response. As seen in the following plots, FIGS. 26A-26C in the same format as Case 1, the approach worked as the FST and ideal results overlay each other. This observation is very strong evidence that the LPM transient response is corrupting the non-zero rectification FST algorithm.

Example 7

Analytical Testing of the Rectification Function with Zeros

The second option of a discrete rectification function for transitioning from +1 to −1, and the reverse, and passing through zero at a discrete time step is examined. Equations 11 and 12, when implemented into the FST algorithm and Equations 1-8, are shown to preserve orthogonality between frequencies. The sine and cosine waveform of such a function are given, respectively, as Equations 11 and 12. These sine and cosine rectification functions with zeros preserve orthogonality between frequencies shown via a MATLAB® matrix calculator computer software code that builds a discrete time record of an SOS where the frequencies are octave harmonics including the sample frequency. All the sinusoids in the SOS start at time zero, have zero phase shift and unity amplitude. All sine waves are used initially and are rectified with the sine and cosine rectification functions for each frequency, as shown in Equations 11 and 12. Then, the SOS is all cosine waves, SOC and rectified with the sine and cosine rectification functions, as shown in Equations 11 and 12. The cross-talk results are expected to always be zero. For this evaluation, the SOS is picked to consist of 10 distinct frequencies, all of which are octave and harmonically related with the highest frequency having 32 samples per period. The time record length is 1 period of the lowest frequency. For Case 1, the SOS is made from discrete sine waves and, for Case 2, the SOS is made from discrete cos waves. Orthogonality is proven by deleting an arbitrary frequency from the SOS or SOC and then trying to detect it with the FST Equations 1 through 8. If the result of detection is zero, then there is no cross-talk from any of the other frequencies and orthogonality is established.

Case 1

Now, if an arbitrary frequency is deleted from the SOS, cross-talk is measured when trying to detect the arbitrary frequency. If there is orthogonality between frequencies, the result should be zero. The 2nd frequency was deleted and the sine and cos results respectively are:

Outs=[0.6366 0.0000 0.6366 0.6366 0.6366 0.6366 0.6366 0.6365 0.6361 0.6346]

Outc=1.0e-013*[0.0003 0.0028 0.0003 −0.0074 −0.0132 −0.0243 −0.0501 −0.1000 −0.1994 −0.3983]

As expected, there was no response at the 2nd frequency or any other frequency that might be deleted from the SOS, thus, there is orthogonality between frequencies. Additionally, there are 13 orders of magnitude difference between sine and cos rectification results; thus, orthogonality also exists between sine and cosine for an SOS. This feature is of interest but not necessary for the subject method employing the FST algorithm.

Case 2

Parameters are the same as in Case 1, except SOS is cosine waves (SOC). Deleting an arbitrary frequency from the SOC and then trying to detect it measures cross-talk. If there is orthogonality between frequencies, the result should be zero. The 7th frequency was deleted and the cos and sine results, respectively, are:

Outc=[0.6366 0.6366 0.6366 0.6366 0.6366 0.6366 −0.0000 0.6365 0.6361 0.6346]

Outs=1.0e-013*[−0.0049 −0.0277 0.0051 0.0140 0.0129 0.0234 0.0032 0.1002 0.1992 0.3983]

As expected, there is no response at the 7th frequency or any other frequency that might be deleted from the SOC. Thus, orthogonality also holds for the SOC. Additionally, there are 13 orders of magnitude difference between cos and sine rectification results; thus, orthogonality between sine and cos for an SOC also exists, an interesting but unnecessary feature.

Example 8

Rectification with Zeros FST Applied to a Battery Model

The rectification with zeros version of the FST embodiment was evaluated with the recursive implementation of the INL LPM exactly as in Example 6.

Case 1

Figure 27A:
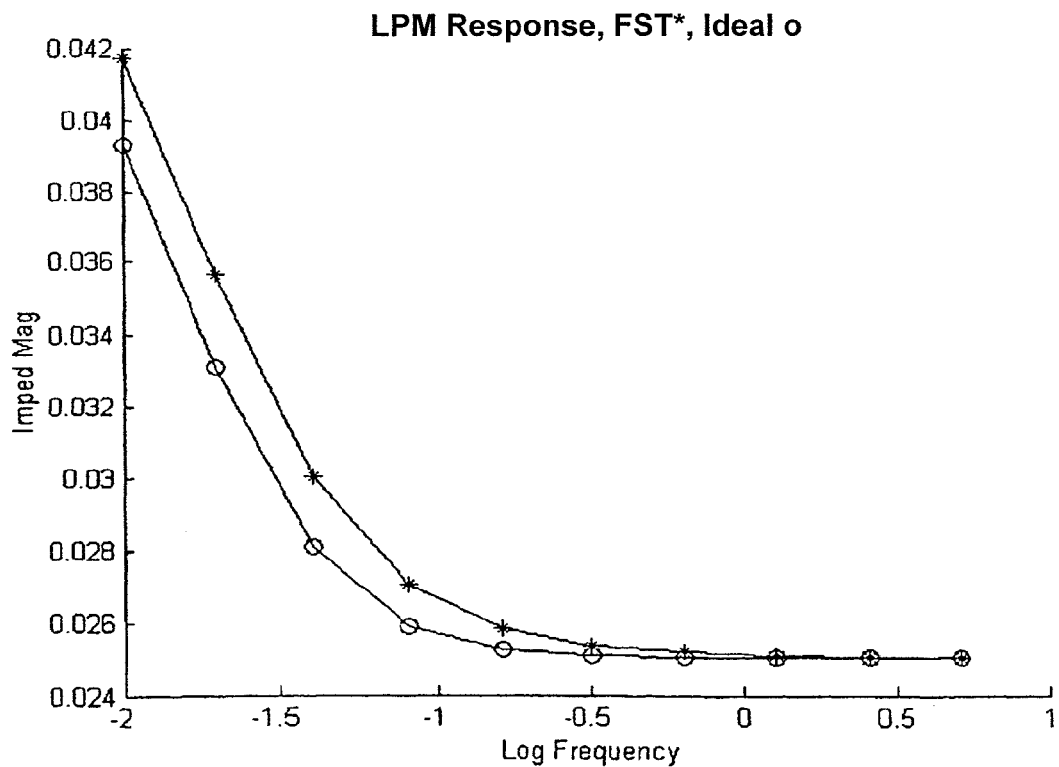
FIG. 27A shows an FST impedance spectrum as magnitude vs. frequency.
Figure 27B:
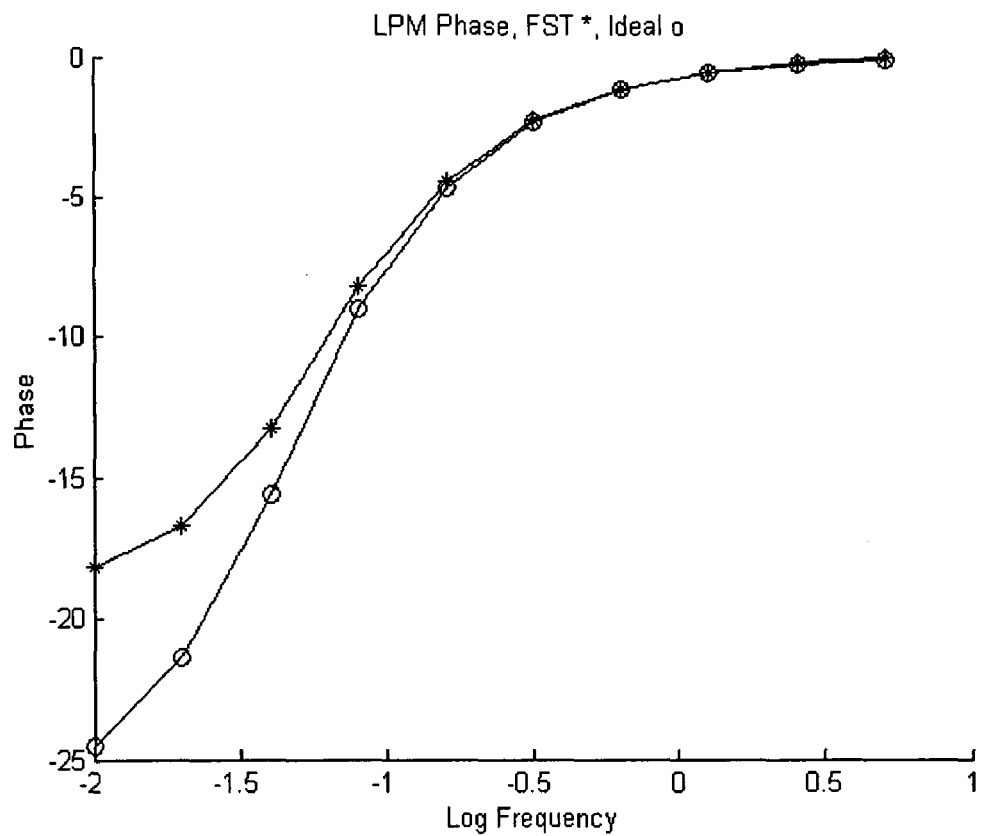
FIG. 27B shows an FST impedance spectrum as phase vs. frequency.
Figure 27C:
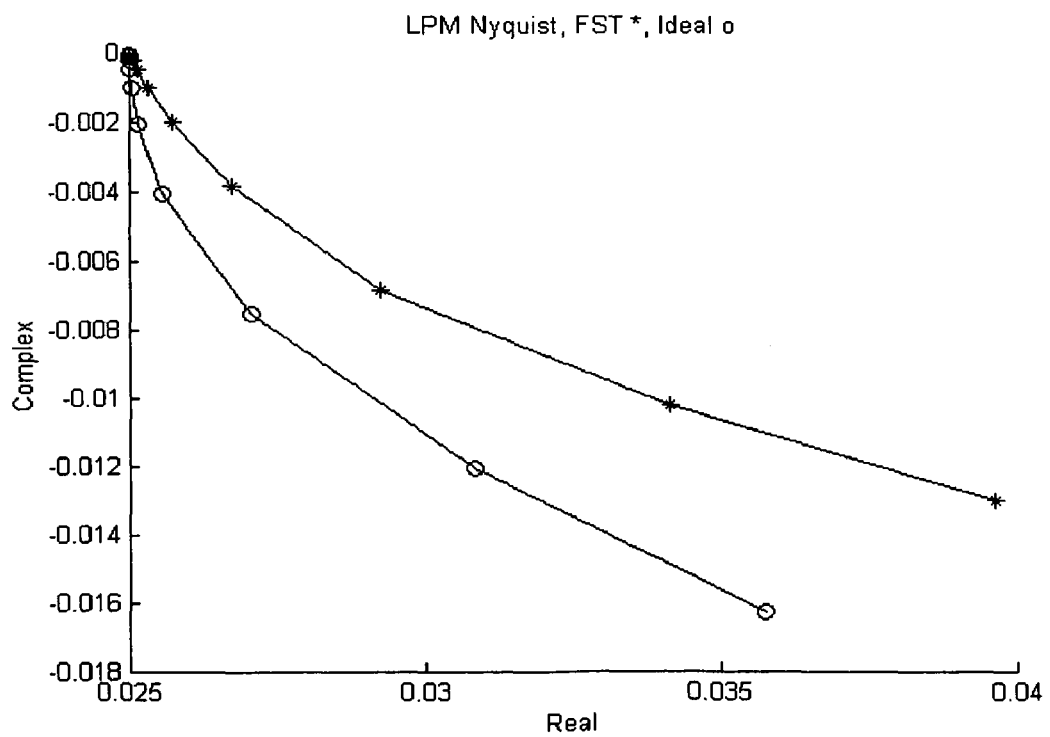
FIG. 27C shows an FST impedance spectrum as the Nyquist plot of imaginary component vs. real component.

In the first case analyzed, the SOS started at 0.01 Hz, had 10 frequencies, the time record length was 1 period of the 0.01 Hz, and the highest frequency had 16 samples. Results shown in FIGS. 27A-27C show the impedance spectrum results, respectively, as magnitude vs. frequency, phase vs. frequency and the Nyquist plot of imaginary component vs. real component.

Case 2

Figure 28A:
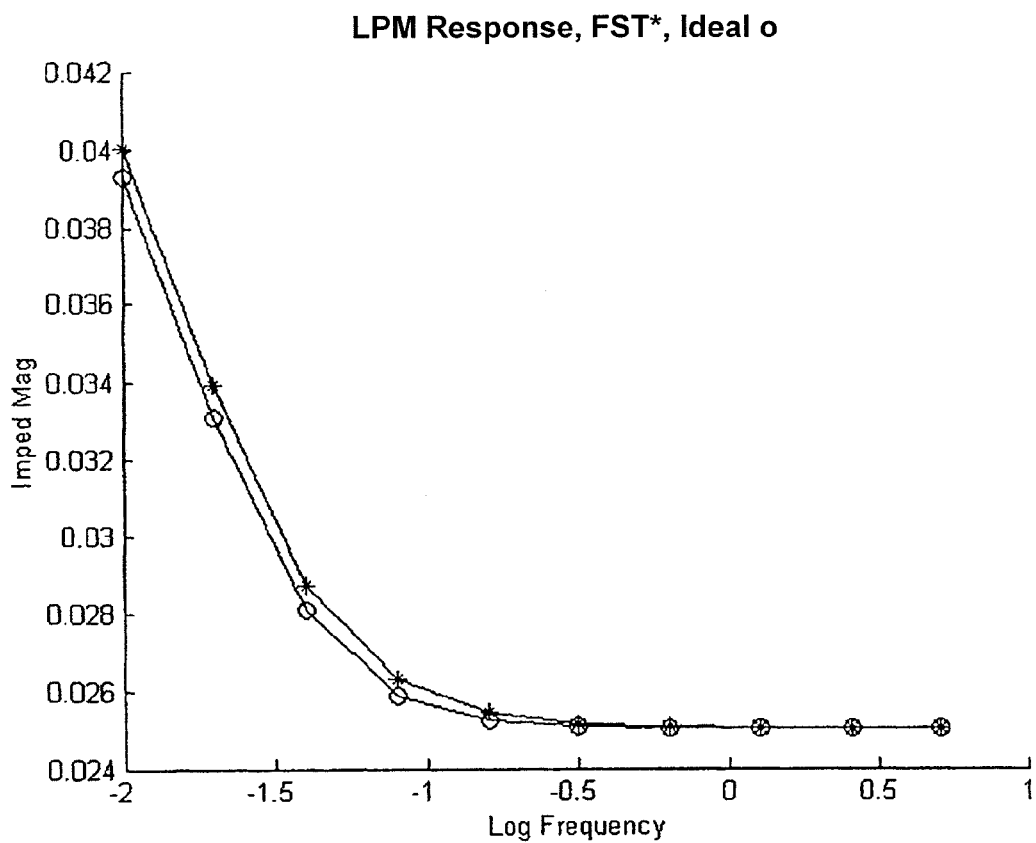
FIG. 28A shows an FST impedance spectrum as magnitude vs. frequency.
Figure 28B:
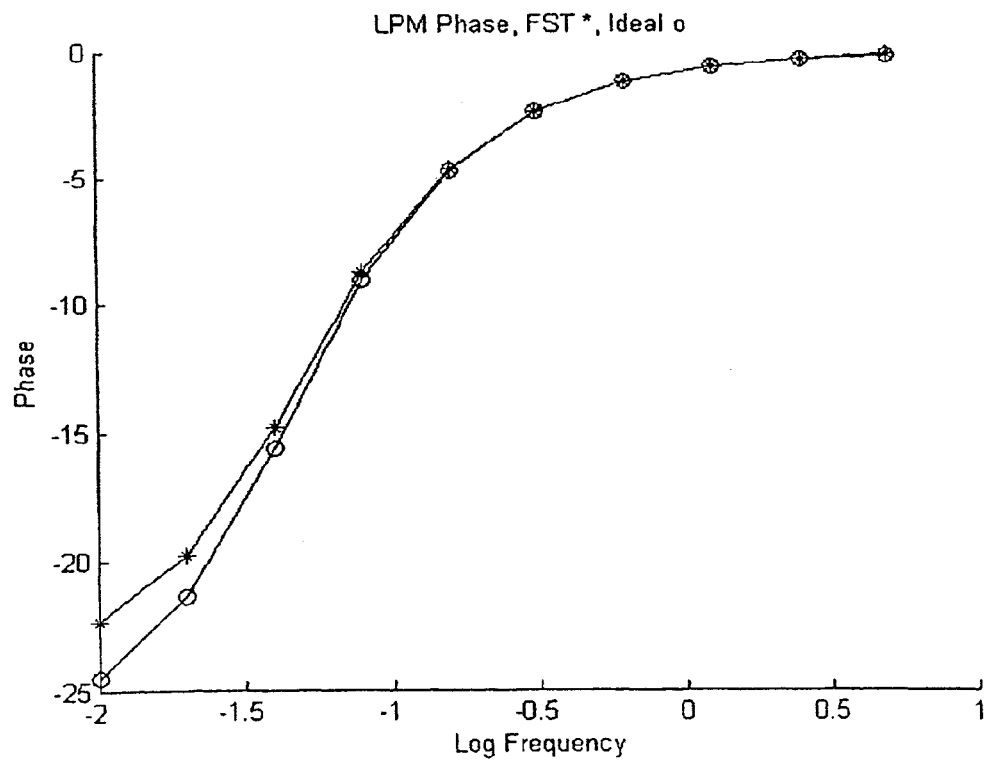
FIG. 28B shows an FST impedance spectrum as phase vs. frequency.
Figure 28C:
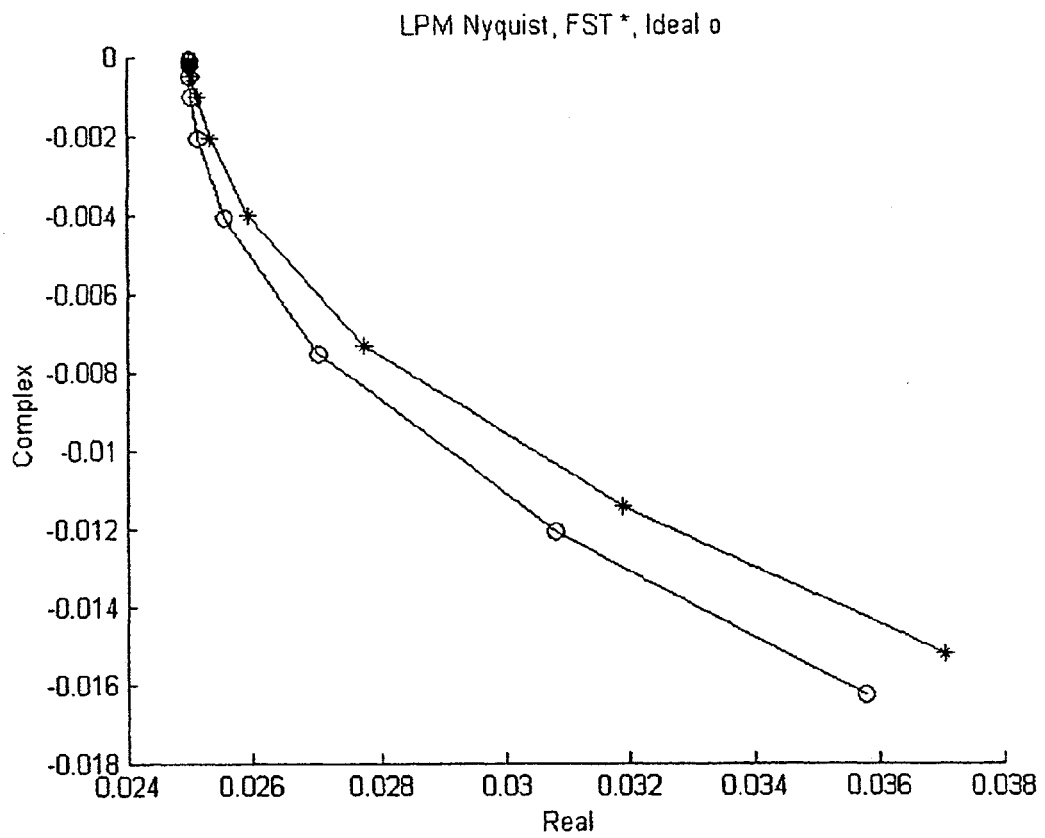
FIG. 28C shows an FST impedance spectrum as a Nyquist plot of imaginary component vs. real component.

Case 2 was likewise run with the parameters of Example 6 (the time record is 3 periods of the lowest frequency). Results are shown in FIGS. 28A-28C in the same format as Case 1.

Case 3

Figure 29A:
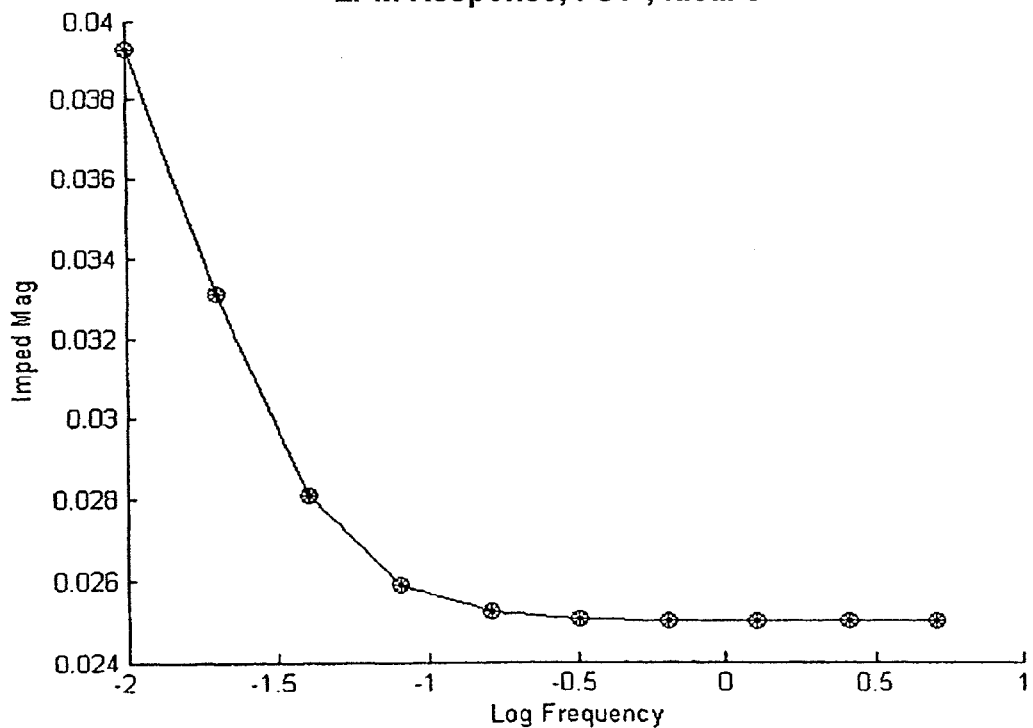
FIG. 29A shows an FST impedance spectrum as magnitude vs. frequency.
Figure 29B:
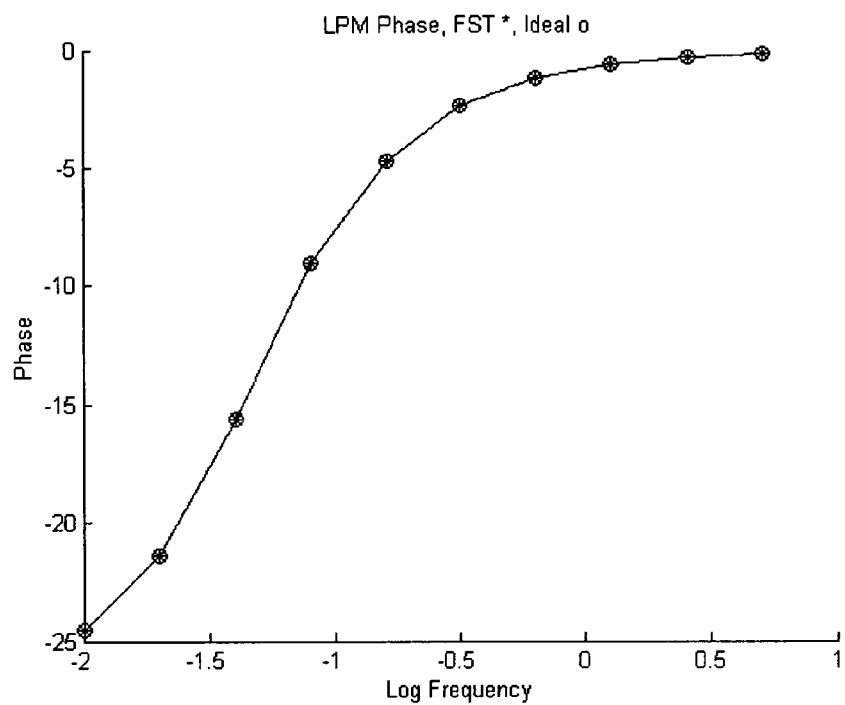
FIG. 29B shows an FST impedance spectrum as phase vs. frequency.
Figure 29C:
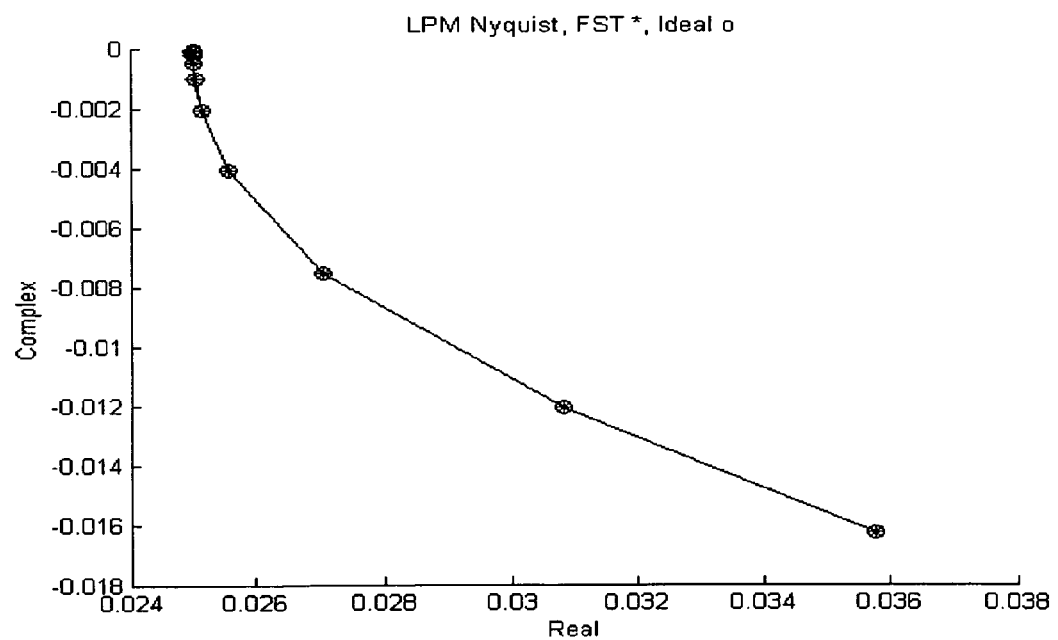
FIG. 29C shows an FST impedance spectrum as a Nyquist plot of imaginary component vs. real component.

Again, Case 2 for rectification with zeros is virtually the same as non-zero rectification. Corruption by LPM transient response is suspected. Case 3 was run exactly as Case 3 for non-zero rectification (a time record of 2 periods of lowest frequency and process with only the second period via zero-rectification FST). The results with the FST algorithm that uses rectification functions with zeros is virtually identical to the non-zero rectification-based FST in that eliminating the first half of the 2-period time record totally eliminates the corruption of results by the LPM transient response. Results are shown in FIGS. 29A-29C in the same format as Case 1.

Conclusions

Zero and non-zero rectification for the subject method using the FST system have both been validated analytically. The rectification without zeros using the preferred means of non-averaging is probably easier to implement for FST as it involves preprocessing the time record by just sign changes, and then just summing all the samples.

It is to be understood that the foregoing examples are merely illustrative of the present invention. Certain modifications of the articles and/or methods employed may be made and still achieve the objectives of the invention. Such modifications are contemplated as within the scope of the claimed invention.

REFERENCES

[1] FreedomCAR Battery Test Manual, Appendix D DOE/ID-11069 October 2003, Idaho National Laboratory.
[2] Ronald C. Fenton, Justin T. Hohn, Peter M. Willson, BSM Development Documentation Senior Project Final Report for the Idaho National Laboratory, Montana Tech of the University of Montana, May 2005.
[3] W. Morrison, Intelligent Self-Evolving Prognostic Fusion, Phase I STTR Interim Report, Qualtech Systems, Inc., July 2005.
[4] Weston Albrecht, "Battery Complex Impedance Identification with Random Signal Techniques," MS thesis submitted to the Department of General Engineering, Montana Tech of the University of Montana, 2005.
[5] J. Morrison, Algorithms as MATLAB Code for Real Time Estimation of Battery Impedance, Letter report to Qualtech Systems, Inc., Montana Tech. of the University of Montana, September 2005.
[6] R. E. Ziemer, W. H. Tranter, "Principles of Communications," 5th edition, John Wiley & Sons, 2002.
[7] P. D. Wasserman, "Advanced Methods in Neural Computing," New York: Van Nostrand Reinhold, 1993.
[8] Alpaydin, Introduction to Machine Learning, Cambridge, Mass., London, England, The MIT Press, 2004.
[9] "Impedance Noise Identification for State-of-Health Prognostics," Jon P. Christophersen, et al., 43$^{rd}$ Power Sources Conference, Jul. 7-10, 2008, Philadelphia, Pa.
[10] "Real Time Estimation of Battery Impedance," J. L. Morrison and W. H. Morrison, IEEE Aerospace 2006 Conference, Mar. 5-11, 2006, Big Sky, Montana.

The invention claimed is:

1. A method for detecting function of a unit under test by measuring frequency response the method comprising; the acts of:

setting measurement conditions comprising choosing a Root Mean Square (RMS) level of current, identifying a start frequency, and choosing a period of a lowest frequency, selecting a number of octave harmonic frequencies relative to the start frequency over which the function of the unit under test will be tested, wherein the number of octave harmonic frequencies is one or more;

assembling an excitation time record including a sum of sinusoids of the number of octave harmonic frequencies and a duration of the period of the lowest frequency;

conditioning the excitation time record to be compatible with the measurement conditions;

exciting the unit under test with the excitation time record and simultaneously capturing a resulting response time record with a data acquisition system having a sample frequency that is octave related and harmonically related to the frequencies within the sum of sinusoids and at least four times the highest frequency in the sum of sinusoids;

rectifying the response time record relative to a sine at each frequency of the octave harmonic frequencies with a first sine rectification sum $m_{11}$, comprising:

$$m_{11} = \text{sum} = \sum_{n=0}^{\frac{N_1}{2}-1} TR(n\Delta t) - \sum_{n=\frac{N_1}{2}}^{N_1-1} TR(n\Delta t)$$

Where: TR is a captured response time record with discrete time index n and duration of one period of a first frequency $f_1$ $N_i$ is a number of sample points for a period of the first frequency $f_1$ wherein for each sum of sinusoid frequencies $f_i$, $N_i$ is constrained as $\log_2(N_i)$ and is an integer greater than 1 and wherein the frequency of interest is given as:

$$f_i = \frac{1}{N_i \Delta t}$$

wherein $\Delta t$ is a sample period summing the sine rectification sum for each frequency of interest of the octave harmonic frequencies to create a sine-rectified response time record sum, normalizing the sine-rectified response time record sum to a number of periods known to be within the sine-rectified response time record sum for each frequency, and storing a normalized sine sum result, $m_{1,i}$, where i is an $i^{th}$ frequency of interest;

rectifying the response time record relative to a cosine at each frequency of the octave harmonic frequencies with a first cosine rectification sum $m_{21}$, comprising:

$$m_{21} = \text{sum} = \sum_{n=0}^{\frac{N_1}{4}-1} TR(n\Delta t) - \sum_{n=\frac{N_1}{4}}^{\frac{3N_1}{4}-1} TR(n\Delta t) + \sum_{n=\frac{3N_1}{4}}^{N_1-1} TR(n\Delta t)$$

summing the cosine rectification sum for each frequency of interest of the octave harmonic frequencies to create a cosine-rectified response time record sum, normalizing the cosine-rectified response time record sum to the number of periods known to be within the cosine-rectified response time record sum for each frequency, and storing a normalized cosine sum result, $m_{2,i}$, where i is the $i^{th}$ frequency of interest;

determining a real and an imaginary form of a magnitude and a phase of each of the octave harmonic frequencies:

$$\begin{bmatrix} V_i \cos\phi_i \\ V_i \sin\phi_i \end{bmatrix} = \begin{bmatrix} \dfrac{K_4}{K_1 K_4 - K_2 K_3}, & \dfrac{K_2}{K_2 K_3 - K_1 K_4} \\ \dfrac{K_3}{K_2 K_3 - K_1 K_4}, & \dfrac{K_1}{K_1 K_4 - K_2 K_3} \end{bmatrix} \begin{bmatrix} m_{1,i} \\ m_{2,i} \end{bmatrix}$$

Where:

$V_i$ is a magnitude of the voltage for the frequency $f_i$ $\phi_i$ is a phase of the voltage for the frequency $f_i$ $m_{1,i}$, $m_{2,i}$ are rectification sums for the frequency $f_i$ $$K_1 = \sum_{n=0}^{\frac{N_i}{2}-1} \left(\sin\left(\frac{2\pi}{N_i}n\right)\right) - \sum_{n=\frac{N_i}{2}}^{N_i-1} \left(\sin\left(\frac{2\pi}{N_i}n\right)\right)$$

$$K_2 = \sum_{n=0}^{\frac{N_i}{2}-1} \left(\cos\left(\frac{2\pi}{N_i}n\right)\right) - \sum_{n=\frac{N_i}{2}}^{N_i-1} \left(\cos\left(\frac{2\pi}{N_i}n\right)\right)$$

$$K_3 = \sum_{n=0}^{\frac{N_i}{4}-1} \left(\sin\left(\frac{2\pi}{N_i}n\right)\right) - \sum_{n=\frac{N_i}{4}}^{3\frac{N_i}{4}-1} \left(\sin\left(\frac{2\pi}{N_i}n\right)\right) + \sum_{n=3\frac{N_i}{4}}^{N_i-1} \left(\sin\left(\frac{2\pi}{N_i}n\right)\right)$$

$$K_4 = \sum_{n=0}^{\frac{N_i}{4}-1} \left(\cos\left(\frac{2\pi}{N_i}n\right)\right) - \sum_{n=\frac{N_i}{4}}^{3\frac{N_i}{4}-1} \left(\cos\left(\frac{2\pi}{N_i}n\right)\right) + \sum_{n=3\frac{N_i}{4}}^{N_i-1} \left(\cos\left(\frac{2\pi}{N_i}n\right)\right)$$

and, obtaining the magnitude and the phase via a standard rectangular to polar conversion:

Let: $\begin{matrix} V_i \sin\phi_i = C_1 \\ V_i \cos\phi_i = C_2 \end{matrix}$, then: $\begin{matrix} V_i = \sqrt{C_1^2 + C_2^2} \\ \phi_i = \tan^{-1}\left(\frac{C_1}{C_2}\right) \end{matrix}$ assembling the magnitude and the phase at each of the octave harmonic frequencies to determine the frequency response.

2. The method of claim 1, wherein rectifying the response time record relative to the sine at each of the octave harmonic frequencies is performed for signals that pass through zero at a discrete time step, wherein N is a number of samples over the period:

$$Rs(n) = \begin{bmatrix} 0, & n=0 \\ 1, & 0 < n < \frac{N}{2} \\ 0, & n = \frac{N}{2} \\ -1, & \frac{N}{2} < n < N \end{bmatrix}.$$

3. The method of claim 1, wherein rectifying the response time record relative to the cosine at each of the octave harmonic frequencies is performed for signals that pass through zero at a discrete time step, wherein N is a number of samples over the period:

$$Rc(n) = \begin{bmatrix} 1, & 0 \leq n < \frac{N}{4} \\ 0, & n = \frac{N}{4} \\ -1, & \frac{N}{4} < n < \frac{3N}{4} \\ 0, & n = \frac{3N}{4} \\ 1 & \frac{3N}{4} < n < N \end{bmatrix}.$$

4. The method of claim 1, further comprising the acts of:
repeating the original acts of; selecting the number of octave harmonic frequencies, assembling the excitation time record, conditioning the excitation time record, exciting the unit under test, rectifying the response time record relative to the sine at each frequency, summing the sine rectification sum for each frequency of interest, rectifying the response time record relative to the cosine at each frequency, summing the cosine rectification sum for each frequency of interest, determining the real and the imaginary form, and assembling the magnitude and the phase, at least once, wherein the octave harmonic frequencies are shifted in the repeated acts relative to the original acts; and interleaving the frequency response of the original acts with the frequency responses of the repeated acts to obtain a higher resolution frequency response.

5. The method of claim 1, wherein:
rectifying the response time record relative to a sine at each frequency of the octave harmonic frequencies includes a second sine rectification sum $m_{12}$, comprising;

$$\text{sum} = \sum_{n=0}^{\frac{N_2}{2}-1} TR(n\Delta t) - \sum_{n=\frac{N_2}{2}}^{N_2-1} TR(n\Delta t) + \sum_{n=N_2}^{N_2+\frac{N_2}{2}-1} TR(n\Delta t) - \sum_{n=N_2+\frac{N_2}{2}}^{2N_2-1} TR(n\Delta t)$$

$$m_{12} = \frac{\text{sum}}{2};$$

and
rectifying the response time record relative to a cosine at each frequency of the octave harmonic frequencies includes a second cosine rectification sum $m_{22}$, comprising;

$$\text{sum} = \sum_{n=0}^{\frac{N_2}{4}-1} TR(n\Delta t) - \sum_{n=\frac{N_2}{4}}^{\frac{3N_2}{4}-1} TR(n\Delta t) + \sum_{n=\frac{3N_2}{4}}^{N_2-1} TR(n\Delta t) +$$

$$\sum_{n=N_2}^{N_2+\frac{N_2}{4}-1} TR(n\Delta t) - \sum_{n=N_2+\frac{N_2}{4}}^{N_2+\frac{3N_2}{4}-1} TR(n\Delta t) + \sum_{n=N_2+\frac{3N_2}{4}}^{2N_2-1} TR(n\Delta t)$$

$$m_{22} = \frac{\text{sum}}{2};$$

where: $N_2$ is a number of sample points in a second frequency at an octave harmonic of the first frequency and $2N_2 = N_1$.

6. The method of claim 5, wherein:
rectifying the response time record relative to a sine at each frequency of the octave harmonic frequencies includes a third sine rectification sum $m_{13}$, comprising;

$$sum = \sum_{n=0}^{\frac{N_3}{2}-1} TR(n\Delta t) - \sum_{n=\frac{N_3}{2}}^{N_3-1} TR(n\Delta t) +$$

$$\sum_{n=N_3}^{N_3+\frac{N_3}{2}-1} TR(n\Delta t) - \sum_{n=N_3+\frac{N_3}{2}}^{2N_3-1} TR(n\Delta t) + \sum_{n=2N_3}^{2N_3+\frac{N_3}{2}-1} TR(n\Delta t) -$$

$$\sum_{n=2N_3+\frac{N_3}{2}}^{3N_3-1} TR(n\Delta t) + \sum_{n=3N_3}^{3N_3+\frac{N_3}{2}-1} TR(n\Delta t) - \sum_{n=3N_3+\frac{N_3}{2}}^{4N_3-1} TR(n\Delta t)$$

$$m_{13} = \frac{sum}{4};$$

and
rectifying the response time record relative to a cosine at each frequency of the octave harmonic frequencies includes a third cosine rectification sum $m_{23}$, comprising, comprising:

$$sum = \sum_{n=0}^{\frac{N_3}{4}-1} TR(n\Delta t) - \sum_{n=\frac{N_3}{4}}^{\frac{3N_3}{4}-1} TR(n\Delta t) + \sum_{n=\frac{3N_3}{4}}^{N_3-1} TR(n\Delta t) +$$

$$\sum_{n=N_3}^{N_3+\frac{N_3}{4}-1} TR(n\Delta t) - \sum_{n=N_3+\frac{N_3}{4}}^{N_3+\frac{3N_3}{4}-1} TR(n\Delta t) + \sum_{n=N_3+\frac{3N_3}{4}}^{2N_3-1} TR(n\Delta t) +$$

$$\sum_{n=2N_3}^{2N_3+\frac{N_3}{4}-1} TR(n\Delta t) - \sum_{n=2N_3+\frac{N_3}{4}}^{2N_3+\frac{3N_3}{4}-1} TR(n\Delta t) + \sum_{n=2N_3+\frac{3N_3}{4}}^{3N_3-1} TR(n\Delta t) +$$

$$\sum_{n=3N_3}^{3N_3+\frac{N_3}{4}-1} TR(n\Delta t) - \sum_{n=3N_3+\frac{N_3}{4}}^{3N_3+\frac{3N_3}{4}-1} TR(n\Delta t) + \sum_{n=3N_3+\frac{3N_3}{4}}^{4N_3-1} TR(n\Delta t)$$

$$m_{23} = \frac{sum}{4};$$

where: $N_3$ is a number of sample points in a third frequency at an octave harmonic of the first frequency and $4N_3 = N_1$.

7. The method of claim 6, comprising:
rectifying the response time record relative to a sine at each frequency of the octave harmonic frequencies includes at least one additional sine rectification sum $m_{1n}$; and
rectifying the response time record relative to a cosine at each frequency of the octave harmonic frequencies includes at least one additional cosine rectification sum $m_{2n}$; wherein a last frequency includes $2^{n-1}$ periods within a period of the first frequency.

8. A method of calibrating phase response of a captured time record for a unit under test by measuring frequency response of a reference standard the method comprising the acts of:

setting measurement conditions comprising choosing a Root Mean Square (RMS) level of current, identifying a start frequency, and choosing a period of a lowest frequency;
determining a theoretical frequency response for the reference standard;
selecting a number of frequencies and a frequency spread over which the reference standard will be tested, wherein the frequency spread is by octaves;
assembling a phase-shifted excitation time record including a sum of sinusoids of the number of frequencies with a pre-selected phase shift, wherein a duration of the excitation time record is greater than or equal to one period of a lowest of the number of frequencies;
conditioning the phase-shifted excitation time record to be compatible with the measurement conditions;
exciting the reference standard with the phase-shifted excitation time record and simultaneously capturing a response time record with a data acquisition system having an appropriate sample frequency;
processing the response time record to obtain estimated magnitude and estimated phase at each of the number of frequencies to determine the frequency response;
wherein, phase calibration is achieved through a selection of multiple known phase-shifts until enough points are obtained to determine phase calibration constants for each of the number of frequencies using a regression analysis.

9. The method of claim 8, wherein the act of processing the response time record includes:
rectifying the response time record relative to a sine at each of the number of frequencies, with a first sine rectification sum $m_{11}$, comprising:

$$m_{11} = sum = \sum_{n=0}^{\frac{N_1}{2}-1} TR(n\Delta t) - \sum_{n=\frac{N_1}{2}}^{N_1-1} TR(n\Delta t)$$

Where: TR is a captured voltage time record with discrete time index n and duration of one period of a first frequency $f_1$
$N_1$ is a number of sample points for a first frequency $f_1$ wherein for each sum of sinusoid frequencies $f_i$, $N_i$ is constrained as $\log_2(N_i)$ and is an integer greater than 1 and wherein the frequency of interest is given as:

$$f_i = \frac{1}{N_i \Delta t}$$

wherein $\Delta t$ is a sample period
summing the sine rectification sum for each frequency of interest of the number of frequencies to create a sine-rectified response time record sum, normalizing the sine-rectified response time record sum to a number of periods known to be within the sine-rectified response time record sum for each frequency, and storing a normalized sine sum result, $m_{1,i}$, where i is the $i^{th}$ frequency of interest;
rectifying the response time record relative to the cosine at each of the number of frequencies, with a first cosine rectification sum $m_{21}$, comprising:

$$m_{21} = \text{sum} = \sum_{n=0}^{\frac{N_1}{4}-1} TR(n\Delta t) - \sum_{n=\frac{N_1}{4}}^{\frac{3N_1}{4}-1} TR(n\Delta t) + \sum_{n=\frac{3N_1}{4}}^{N_1-1} TR(n\Delta t)$$

summing the cosine rectification sum for each of the number of frequencies to create a cosine-rectified response time record sum, normalizing the cosine-rectified response time record sum to the number of periods known to be within the cosine-rectified time record sum for each frequency, and storing a normalized cosine sum result, $m_{2,i}$, where i is an $i^{th}$ frequency of interest;

determining the real and imaginary form of the magnitude and phase of each octave harmonic frequency:

$$\begin{bmatrix} V_i\cos\phi_i \\ V_i\sin\phi_i \end{bmatrix} = \begin{bmatrix} \frac{K_4}{K_1K_4-K_2K_3}, & \frac{K_2}{K_2K_3-K_1K_4} \\ \frac{K_3}{K_2K_3-K_1K_4}, & \frac{K_1}{K_1K_4-K_2K_3} \end{bmatrix} \begin{bmatrix} m_{1,i} \\ m_{2,i} \end{bmatrix}$$

Where:
$V_i$ is a magnitude of the voltage for the frequency $f_i$
$\phi_i$ is a phase of the voltage for the frequency $f_i$
$m_{1,i}$, $m_{2,i}$ are rectification sums for the frequency $f_i$ $$K_1 = \sum_{n=0}^{\frac{N_i}{2}-1}\left(\sin\left(\frac{2\pi}{N_i}n\right)\right) - \sum_{n=\frac{N_i}{2}}^{N_i-1}\left(\sin\left(\frac{2\pi}{N_i}n\right)\right)$$

$$K_2 = \sum_{n=0}^{\frac{N_i}{2}-1}\left(\cos\left(\frac{2\pi}{N_i}n\right)\right) - \sum_{n=\frac{N_i}{2}}^{N_i-1}\left(\cos\left(\frac{2\pi}{N_i}n\right)\right)$$

$$K_3 = \sum_{n=0}^{\frac{N_i}{4}-1}\left(\sin\left(\frac{2\pi}{N_i}n\right)\right) - \sum_{n=\frac{N_i}{4}}^{3\frac{N_i}{4}-1}\left(\sin\left(\frac{2\pi}{N_i}n\right)\right) + \sum_{n=3\frac{N_i}{4}}^{N_i-1}\left(\sin\left(\frac{2\pi}{N_i}n\right)\right)$$

$$K_4 = \sum_{n=0}^{\frac{N_i}{4}-1}\left(\cos\left(\frac{2\pi}{N_i}n\right)\right) - \sum_{n=\frac{N_i}{4}}^{3\frac{N_i}{4}-1}\left(\cos\left(\frac{2\pi}{N_i}n\right)\right) + \sum_{n=3\frac{N_i}{4}}^{N_i-1}\left(\cos\left(\frac{2\pi}{N_i}n\right)\right)$$

and, obtaining the magnitude and the phase via a standard rectangular to polar conversion:

Let: $\begin{aligned} V_i\sin\phi_i &= C_1 \\ V_i\cos\phi_i &= C_2 \end{aligned}$, then: $\begin{aligned} V_i &= \sqrt{C_1^2 + C_2^2} \\ \phi_i &= \tan^{-1}\left(\frac{C_1}{C_2}\right) \end{aligned}$.

10. The method of claim 9, wherein:
rectifying the response time record relative to a sine at each of the number of frequencies includes a second sine rectification sum $m_{12}$, comprising:

$$\text{sum} = \sum_{n=0}^{\frac{N_2}{2}-1} TR(n\Delta t) - \sum_{n=\frac{N_2}{2}}^{N_2-1} TR(n\Delta t) + \sum_{n=N_2}^{N_2+\frac{N_2}{2}-1} TR(n\Delta t) - \sum_{n=N_2+\frac{N_2}{2}}^{2N_2-1} TR(n\Delta t)$$

$$m_{12} = \frac{\text{sum}}{2};$$

and rectifying the response time record relative to a cosine at each of the number of frequencies includes a second cosine rectification sum $m_{22}$, comprising:

$$\text{sum} = \sum_{n=0}^{\frac{N_2}{4}-1} TR(n\Delta t) - \sum_{n=\frac{N_2}{4}}^{\frac{3N_2}{4}-1} TR(n\Delta t) + \sum_{n=\frac{3N_2}{4}}^{N_2-1} TR(n\Delta t) +$$

$$\sum_{n=N_2}^{N_2+\frac{N_2}{4}-1} TR(n\Delta t) - \sum_{n=N_2+\frac{N_2}{4}}^{N_2+\frac{3N_2}{4}-1} TR(n\Delta t) + \sum_{n=N_2+\frac{3N_2}{4}}^{2N_2-1} TR(n\Delta t)$$

$$m_{22} = \frac{\text{sum}}{2};$$

where: $N_2$ is a number of sample points in a second frequency at an octave harmonic of the first frequency and $2N_2=N_1$.

11. The method of claim 10, wherein:
rectifying the response time record relative to a sine at each of the number of frequencies includes a third sine rectification sum $m_{13}$, comprising:

$$\text{sum} = \sum_{n=0}^{\frac{N_3}{2}-1} TR(n\Delta t) - \sum_{n=\frac{N_3}{2}}^{N_3-1} TR(n\Delta t) +$$

$$\sum_{n=N_3}^{N_3+\frac{N_3}{2}-1} TR(n\Delta t) - \sum_{n=N_3+\frac{N_3}{2}}^{2N_3-1} TR(n\Delta t) + \sum_{n=2N_3}^{2N_3+\frac{N_3}{2}-1} TR(n\Delta t) -$$

$$\sum_{n=2N_3+\frac{N_3}{2}}^{3N_3-1} TR(n\Delta t) + \sum_{n=3N_3}^{3N_3+\frac{N_3}{2}-1} TR(n\Delta t) - \sum_{n=3N_3+\frac{N_3}{2}}^{4N_3-1} TR(n\Delta t)$$

$$m_{13} = \frac{\text{sum}}{4};$$

and
rectifying the response time record relative to a cosine at each of the number of frequencies includes a third cosine rectification sum $m_{23}$, comprising, comprising:

$$\text{sum} = \sum_{n=0}^{\frac{N_3}{4}-1} TR(n\Delta t) - \sum_{n=\frac{N_3}{4}}^{\frac{3N_3}{4}-1} TR(n\Delta t) + \sum_{n=\frac{3N_3}{4}}^{N_3-1} TR(n\Delta t) +$$

$$\sum_{n=N_3}^{N_3+\frac{N_3}{4}-1} TR(n\Delta t) - \sum_{n=N_3+\frac{N_3}{4}}^{N_3+\frac{3N_3}{4}-1} TR(n\Delta t) + \sum_{n=N_3+\frac{3N_3}{4}}^{2N_3-1} TR(n\Delta t) +$$

$$\sum_{n=2N_3}^{2N_3+\frac{N_3}{4}-1} TR(n\Delta t) - \sum_{n=2N_3+\frac{N_3}{4}}^{2N_3+\frac{3N_3}{4}-1} TR(n\Delta t) + \sum_{n=2N_3+\frac{3N_3}{4}}^{3N_3-1} TR(n\Delta t) +$$

-continued $$\sum_{n=3N_3}^{3N_3+\frac{N_3}{4}-1} TR(n\Delta t) - \sum_{n=3N_3+\frac{N_3}{4}}^{3N_3+\frac{3N_3}{4}-1} TR(n\Delta t) + \sum_{n=3N_3+\frac{3N_3}{4}}^{4N_3-1} TR(n\Delta t)$$

$$m_{23} = \frac{\text{sum}}{4};$$

where: $N_3$ is a number of sample points in a third frequency at an octave harmonic of the first frequency and $4N_3 = N_1$.

12. The method of claim 11, wherein:
rectifying the response time record relative to a sine at each of the number of frequencies includes at least one additional sine rectification sum $m_{1n}$; and
rectifying the response time record relative to a cosine at each of the number of frequencies includes at least one additional sine rectification sum $m_{2n}$;
wherein a last frequency includes $2^{n-1}$ periods within a period of the first frequency.

* * * * *

UNITED STATES PATENT AND TRADEMARK OFFICE
CERTIFICATE OF CORRECTION

| | | |
|---|---|---|
| PATENT NO. | : 8,150,643 B1 | Page 1 of 1 |
| APPLICATION NO. | : 12/217013 | |
| DATED | : April 3, 2012 | |
| INVENTOR(S) | : John L. Morrison et al. | |

It is certified that error appears in the above-identified patent and that said Letters Patent is hereby corrected as shown below:

On the title page:
In ITEM (75) Inventors:     Please insert a new last-named inventor
         --Chester G. Motloch, Idaho Falls, ID (US)--

The revised Item (75) Inventors, will now appear as
         follows:

--Inventors:  John L. Morrison, Butte, MT (US);
         William H. Morrison, Manchester, CT (US);
         Jon P. Christophersen, Idaho Falls, ID (US);
         Chester G. Motloch, Idaho Falls, ID (US)--

Signed and Sealed this
First Day of March, 2016

Michelle K. Lee
*Director of the United States Patent and Trademark Office*

UNITED STATES PATENT AND TRADEMARK OFFICE
CERTIFICATE OF CORRECTION

| | |
|---|---|
| PATENT NO. | : 8,150,643 B1 |
| APPLICATION NO. | : 12/217013 |
| DATED | : April 3, 2012 |
| INVENTOR(S) | : John L. Morrison et al. |

Page 1 of 1

It is certified that error appears in the above-identified patent and that said Letters Patent is hereby corrected as shown below:

In the specification:

COLUMN 1, LINES 22-28,   below header
   "STATEMENT REGARDING FEDERALLY SPONSORED RESEARCH OR DEVELOPMENT"
replace paragraph
   "The subject invention was made with government support under a research project supported by NASA, Grant No. NNA05AC24C. The government has certain rights in this invention. Further, the United States Government has certain rights in this invention pursuant to Contract No. DE-AC07-05ID14517 between the United States Department of Energy and Batelle Energy Alliance, LLC."
with
   --The invention was made with government support under Grant No. NNA05AC24C and with government support under Contract No. DE-AC07-05ID14517. The government has certain rights in the invention.--

In the claims:

| | | | |
|---|---|---|---|
| CLAIM 6, | COLUMN 27, | LINES 29-30, | change "comprising, comprising:" to --comprising:-- |
| CLAIM 11, | COLUMN 31, | LINE 4, | change "comprising, comprising:" to --comprising:-- |

Signed and Sealed this
Twenty-fourth Day of May, 2016

Michelle K. Lee
*Director of the United States Patent and Trademark Office*